(12) United States Patent
Son et al.

(10) Patent No.: US 11,335,707 B2
(45) Date of Patent: May 17, 2022

(54) DISPLAY APPARATUS AND METHOD OF MANUFACTURING THE SAME

(71) Applicant: SAMSUNG DISPLAY CO., LTD., Yongin-si (KR)

(72) Inventors: Kyoung Seok Son, Yongin-si (KR); Myounghwa Kim, Yongin-si (KR); Jaybum Kim, Yongin-si (KR); Yeon Keon Moon, Yongin-si (KR); Masataka Kano, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 346 days.

(21) Appl. No.: 16/371,433

(22) Filed: Apr. 1, 2019

(65) Prior Publication Data

US 2019/0312061 A1  Oct. 10, 2019

(30) Foreign Application Priority Data

Apr. 4, 2018 (KR) .......................... 10-2018-0039301

(51) Int. Cl.
*H01L 27/12* (2006.01)
*H01L 27/32* (2006.01)

(52) U.S. Cl.
CPC ........ *H01L 27/1218* (2013.01); *H01L 27/127* (2013.01); *H01L 27/1225* (2013.01); *H01L 27/3246* (2013.01); *H01L 27/3248* (2013.01)

(58) Field of Classification Search
CPC ............... H01L 27/1218; H01L 27/127; H01L 27/3248; H01L 27/3246; H01L 27/1225; H01L 27/3262; H01L 27/1251; H01L 27/124; H01L 29/41733
See application file for complete search history.

(56) References Cited

U.S. PATENT DOCUMENTS

| | | | |
|---|---|---|---|
| 9,129,927 B2 | 9/2015 | Gupta et al. | |
| 9,721,973 B2* | 8/2017 | Lee | H01L 27/1229 |
| 2007/0247887 A1* | 10/2007 | Park | G11C 16/0408 |
| | | | 365/63 |
| 2011/0049507 A1* | 3/2011 | Choi | H01L 27/1251 |
| | | | 257/43 |
| 2015/0102355 A1* | 4/2015 | Yang | H01L 27/1259 |
| | | | 257/72 |
| 2015/0108454 A1* | 4/2015 | Kim | H01L 29/78618 |
| | | | 257/40 |
| 2015/0115256 A1* | 4/2015 | You | H01L 27/1255 |
| | | | 257/40 |

(Continued)

FOREIGN PATENT DOCUMENTS

JP   2007-299913 A   11/2007
KR   10-2014-0054455   5/2014

*Primary Examiner* — Kyoung Lee
*Assistant Examiner* — Christina A Sylvia
(74) *Attorney, Agent, or Firm* — Kile Park Reed & Houtteman PLLC

(57) ABSTRACT

A display apparatus includes a base substrate, a polysilicon active pattern disposed on the base substrate, including polycrystalline silicon, including a source region and a drain region each doped with impurities and a channel region between the source region and the drain region, and including indium, a first gate electrode overlapping the channel region, and a source electrode electrically connected to the source region and a drain electrode electrically connected to the drain region.

22 Claims, 20 Drawing Sheets

(56) References Cited

U.S. PATENT DOCUMENTS

2016/0254387 A1\* 9/2016 Yamazaki ......... H01L 29/78618
                                                          257/43
2018/0108786 A1\* 4/2018 Xu .................... H01L 29/41733

\* cited by examiner

DISPLAY APPARATUS AND METHOD OF MANUFACTURING THE SAME

CROSS-REFERENCE TO RELATED APPLICATION

Korean Patent Application No. 10-2018-0039301, filed on Apr. 4, 2018, in the Korean Intellectual Property Office, and entitled: "Display Apparatus and Method of Manufacturing the Same," is incorporated by reference herein in its entirety.

BACKGROUND

1. Field

Embodiments relate to a display apparatus and a method of manufacturing the display apparatus.

2. Description of the Related Art

Recently, a display apparatus having light weight and small size has been manufactured. A cathode ray tube (CRT) display apparatus has been used due to performance and a competitive price. However the CRT display apparatus has a weakness with a size or portability. Therefore a display apparatus such as a plasma display apparatus, a liquid crystal display apparatus, and an organic light emitting display apparatus has been highly regarded due to small size, light weight, and low-power-consumption. A pixel circuit of the display apparatus may include a plurality of thin film transistors.

SUMMARY

Embodiments are directed to a display apparatus, including a base substrate, a polysilicon active pattern disposed on the base substrate, including polycrystalline silicon, including a source region and a drain region each doped with impurities and a channel region between the source region and the drain region, and including indium, a first gate electrode overlapping the channel region, and a source electrode electrically connected to the source region and a drain electrode electrically connected to the drain region.

The display apparatus may further include an oxide semiconductor pattern disposed on the base substrate. The oxide semiconductor may contact one or more of source electrode and the drain electrode, or the oxide semiconductor may be separate from and adjacent to one or more of the source electrode and the drain electrode.

The oxide semiconductor pattern may be between the source electrode and the source region and between the drain electrode and the drain region.

The display apparatus may further include a buffer layer between the polysilicon active pattern and the base substrate, a first insulation layer between the polysilicon active pattern and the first gate electrode, and a second insulation layer between the source and drain electrodes and the first gate electrode. First and second contact holes may be formed through the first insulation layer, and the polysilicon active pattern may be electrically connected to the source and drain electrodes through the first and second contact holes.

The oxide semiconductor pattern may be a dummy pattern that is floated, the oxide semiconductor pattern being between the source electrode and the drain electrode on the second insulation layer.

The oxide semiconductor pattern may be in the first and second contact holes, and the oxide semiconductor pattern may be in contact with the source electrode and the source region, or in contact with the drain electrode and the drain region.

The display apparatus may further include a second gate electrode. The second insulation layer may include a second_first insulation layer and a second_second insulation layer on the second_first insulation layer, and the second gate electrode may be between the second_first insulation layer and the second_second insulation layer.

The display apparatus may further include an oxide gate electrode between the second insulation layer and the first insulation layer, an oxide semiconductor active pattern overlapping the oxide gate electrode, and on the second insulation layer, and an oxide source electrode and an oxide drain electrode partially overlapping the oxide active pattern. The oxide semiconductor active pattern and the oxide semiconductor pattern may be formed from a same layer, and the oxide source electrode and the oxide drain electrode may be formed from the source electrode and the drain electrode.

The display apparatus may further include a driving active pattern on the base substrate, the driving active pattern including polycrystalline silicon, the driving active pattern including source and drain regions doped with impurities, and the driving active pattern including a channel region between the source region and the drain region, a driving gate electrode overlapping the channel region of the driving active pattern, and driving source and driving drain electrodes electrically connected to the source and drain region of the driving active pattern, respectively. An amount of indium introduced into the polysilicon active pattern may be higher than that of the driving active pattern.

The oxide semiconductor pattern may not be adjacent to and may not make contact with a driving thin film transistor that includes the driving active pattern, the driving gate electrode, and the driving source and drain electrodes, and the oxide semiconductor pattern may be adjacent to or make contact with a thin film transistor that includes the polysilicon active pattern, the first gate electrode, the source electrode, and the drain electrode.

Embodiments are also directed to a method of manufacturing a display apparatus, the method including forming a polysilicon active pattern on a base substrate, the polysilicon active pattern including polycrystalline silicon, forming a first insulation layer, forming a gate electrode on the first insulation layer, forming a second insulation layer on the first insulation layer on which the gate electrode is formed, forming an oxide semiconductor pattern including an oxide semiconductor on the second insulation layer, and forming a source electrode and a drain electrode on the second insulation layer on which the oxide semiconductor pattern is formed.

The method may further include forming a contact hole that exposes the polysilicon active pattern through the first and second insulation layers. In forming the oxide semiconductor pattern, the oxide semiconductor pattern may be formed in the contact hole exposing the polysilicon active pattern.

The method may further include annealing the oxide semiconductor pattern.

The oxide semiconductor pattern may be in the contact hole, and the oxide semiconductor pattern may be in contact with the source electrode or in contact with the drain electrode.

The method may further include a process of increasing electrical conductivity of the oxide semiconductor pattern.

The oxide semiconductor pattern may be a dummy pattern that is floated, the oxide semiconductor pattern being between the source electrode and the drain electrode on the second insulation layer.

In forming the gate electrode, an oxide gate electrode may be further formed, in forming the semiconductor pattern, an oxide semiconductor active pattern overlapping the oxide gate electrode may be further formed on the second insulation layer, and in forming the source and drain electrodes, an oxide source electrode and an oxide drain electrode that partially overlap the oxide semiconductor active pattern may be further formed.

Forming the gate electrode and the oxide semiconductor and forming the second insulation layer may include forming a first gate pattern including the gate electrode overlapping the polysilicon active pattern on the first insulation layer, forming a second_first insulation layer on the first insulation layer on which the first gate pattern is formed, forming a second gate pattern and the oxide gate electrode, and forming a second_second insulation layer on the second gate pattern and the oxide gate electrode.

In forming the polysilicon active pattern, a driving active pattern including the polycrystalline silicon may be further formed, in forming the gate electrode, a driving gate electrode may be further formed, in forming the oxide semiconductor pattern, the oxide semiconductor pattern may be adjacent to or in contact with a thin film transistor that includes the polysilicon active pattern, the gate electrode, the source electrode, and the drain electrode, and the oxide semiconductor pattern may not be adjacent to or may not make contact with a driving thin film transistor that includes the driving active pattern.

The second insulation layer may include silicon oxide.

BRIEF DESCRIPTION OF THE DRAWINGS

Features will become apparent to those of skill in the art by describing in detail example embodiments with reference to the attached drawings in which.

DETAILED DESCRIPTION

Figure 1:
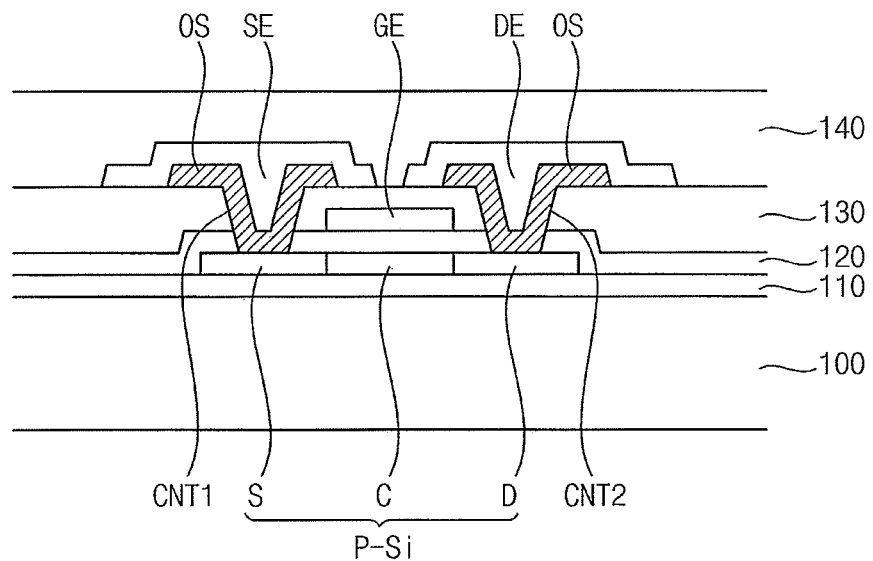
FIG. 1 illustrates a cross-sectional view of a display apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

FIG. 1 illustrates a cross-sectional view of a display apparatus according to an example embodiment.

Referring to FIG. 1, the display apparatus may include a base substrate 100, a buffer layer 110, a polysilicon active pattern p-Si, a first insulation layer 120, a gate electrode GE, a second insulation layer 130, an oxide semiconductor pattern OS, a source electrode SE, a drain electrode DE, and a third insulation layer 140.

The base substrate 100 may include transparent or opaque insulation materials. For example, the base substrate 100 may include a quartz substrate, a synthetic quartz substrate, a calcium fluoride substrate, a fluoride-doped quartz substrate, a sodalime glass substrate, a non-alkali glass substrate, etc. In another implementation, the base substrate 100 may include a flexible transparent material such as a flexible transparent resin substrate (e.g., a polyimide substrate). In this case, the polyimide substrate may include a first polyimide layer, a barrier film layer, a second polyimide layer, etc. For example, the polyimide substrate may have a configuration where the first polyimide layer, the barrier film layer, and the second polyimide layer are stacked on a rigid glass substrate. Since the polyimide substrate is relatively thin and flexible, the polyimide substrate may be formed on a rigid glass substrate to help support the formation of an upper structure (e.g., a thin film transistor, a light emitting structure, etc.). In a manufacturing the display apparatus, after an insulation layer (e.g., a buffer layer) is provided on the second polyimide layer of the polyimide substrate, the upper structure may be formed on the insulation layer. After the upper structure is formed on the buffer layer, the rigid glass substrate on which the polyimide substrate is formed may be removed. It may be difficult to directly form the upper structure on the polyimide substrate because the polyimide substrate is relatively thin and flexible. Accordingly, the upper structure may be formed on the polyimide substrate and the rigid glass substrate, and then the polyimide substrate may serve as the base substrate 100 after the removal of the rigid glass substrate.

The buffer layer 110 may be disposed on the base substrate 100. The buffer layer 110 may be disposed on the entirety of the base substrate 100. The buffer layer 110 may prevent the diffusion of metal atoms and/or impurities from the base substrate 100 into the polysilicon active pattern p-Si. In addition, the buffer layer 110 may control a rate of a heat transfer in a crystallization process for forming the polysilicon active pattern p-Si, which may help in obtaining substantially uniform the polysilicon active pattern p-Si. Further, the buffer layer 110 may improve a surface flatness of the base substrate 100 when a surface of the base substrate 100 is relatively irregular. According to a type of the base substrate 100, at least two buffer layers may be provided on the base substrate 100, or the buffer layer 110 may not be provided. The buffer layer 110 may include, for example, organic materials or inorganic materials.

The polysilicon active pattern p-Si may be disposed on the buffer layer 110. The polysilicon active pattern p-Si may include polycrystalline silicon. The polysilicon active pattern p-Si may include drain and source regions D and S doped with an impurity and a channel region C between the drain region D and the source region S. The polycrystalline silicon may be formed by first depositing amorphous silicon and then crystallizing it. The amorphous silicon may be crystallized by rapid thermal annealing (RTA), solid phase crystallization (SPC), excimer laser annealing (ELA), metal induced crystallization (MIC), metal induced lateral crystallization (MILC), sequential lateral solidification (SLS) and the like. In an implementation, the polycrystalline silicon may be formed through a low temperature polysilicon (LTPS) process. The source region S and the drain region D may be formed by doping a portion of the polysilicon active pattern p-Si with an impurity. The polysilicon active pattern p-Si may include indium (In) (or the like) derived from the oxide semiconductor pattern OS, as described in further detail below.

The first insulation layer 120 may be disposed on the buffer layer 110 on which the polysilicon active pattern p-Si is disposed. For example, the first insulation layer 120 may cover the polysilicon active pattern p-Si on the buffer layer 110, and may be disposed as a substantially uniform thickness along a profile of the polysilicon active pattern p-Si. In another implementation, the first insulation layer 120 may cover the polysilicon active pattern p-Si on the buffer layer 110, and may have a substantially flat upper surface without a step around the polysilicon active pattern p-Si. The first insulation layer 120 may include a silicon compound, a metal oxide, etc. For example, the first insulation layer 120 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc.

The gate electrode GE may be disposed on the first insulation layer 120. The gate electrode GE may include a metal, a metal alloy, a metal nitride, a conductive metal oxide, a transparent conductive material, etc.

The second insulation layer 130 may be disposed on the first insulation layer 120 on which the gate electrode GE is disposed. For example, the second insulation layer 130 may cover the gate electrode GE on the first insulation layer 120, and may be disposed as a substantially uniform thickness along a profile of the gate electrode GE. In another implementation, the second insulation layer 130 may cover the gate electrode GE on the first insulation layer 120, and may have a substantially flat upper surface without a step around the gate electrode GE. The second insulation layer 130 may include a silicon compound, a metal oxide, etc. For example, the second insulation layer 130 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. The second insulation layer 130 may be formed of a plurality of layers.

Here, an uppermost portion of the second insulation layer 130, that is, a portion in contact with the oxide semiconductor pattern OS may be formed of a layer containing silicon oxide.

A first contact hole CNT1 that exposes the source region of the polysilicon active pattern p-Si and a second contact hole CNT2 that exposes the drain region of the polysilicon active pattern p-Si may be formed through the second insulation layer 130.

The oxide semiconductor pattern OS may be disposed in the first and second contact holes CNT1 and CNT2 of the second insulation layer 130, respectively. The oxide semiconductor pattern OS may include an oxide semiconductor. Thus, the oxide semiconductor pattern OS may include an oxide semiconductor layer including, for example, a two-component compound ($AB_x$), a ternary compound ($AB_xC_y$), a four-component compound ($AB_xC_yD_z$), etc. These compounds may contain indium (In), zinc (Zn), gallium (Ga), tin (Sn), titanium (Ti), aluminum (Al), hafnium (Hf), zirconium (Zr), magnesium (Mg), etc. For example, the oxide semiconductor pattern OS may include at least one of zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), etc. For example, the oxide semiconductor pattern OS may include indium (In).

The oxide semiconductor pattern OS may serve as a semiconductor feature and as a conductor. Thus, the oxide semiconductor pattern OS may have a characteristic as a conductor, and may be treated by a process such as a plasma treatment for improving electrical conductivity.

The source electrode SE and the drain electrode DE may be disposed on the oxide semiconductor pattern OS. The source electrode SE and the drain electrode DE may be formed using a metal, an alloy, a metal nitride, a conductive metal oxide, a transparent conductive material, or the like. The source electrode SE may be electrically connected to the source region S of the polysilicon active pattern p-Si through the semiconductor pattern OS of the first contact hole CNT1. The drain electrode DE may be electrically connected to the drain region D of the polysilicon active pattern p-Si through the semiconductor pattern OS of the second contact hole CNT2.

The third insulation layer 140 may be disposed on the second insulation layer 130 on which the source electrode SE and the drain electrode DE are disposed. The third insulation layer 140 may have a single-layer structure, or may have a multi-layer structure including at least two insulation layers. In example embodiments, the third insulation layer 140 may include organic materials such as a polyimide, an epoxy-based resin, an acryl-based resin, a polyester, a photoresist, a polyacryl-based resin, a polyimide-based resin, a polyamide-based resin, a siloxane-based resin, etc.

The gate electrode GE, the polysilicon active pattern p-Si, the oxide semiconductor pattern OS, the source electrode SE, and the drain electrode DE may be included in a thin film transistor.

According to the present example embodiment, the polysilicon active pattern p-Si of the thin film transistor of the display apparatus may be in direct contact with the oxide semiconductor pattern OS in the process of forming the oxide semiconductor pattern OS, so that electron mobility of the polysilicon active pattern p-Si may be improved, wherein the oxide semiconductor pattern OS affects the polysilicon active pattern p-Si in the process of forming the oxide semiconductor pattern OS, separately from the impurity doping process to the polysilicon active pattern p-Si. Therefore, the electrical characteristics of the thin film transistor may be improved.

When the electron mobility of the polysilicon thin film transistor of a comparative example is 62±3 (cm$^2$/V·s), Vth (threshold voltage) is 2.36±0.11, and DR (driving range) is 2.05±0.07, the electron mobility has been improved to 77±4 (cm$^2$/V·s), the Vth (threshold voltage) has been improved to −0.9±0.16, and the DR (driving range) has been improved to 1.41±0.06 as the oxide semiconductor pattern OS is added in the comparative example as in the present example embodiment.

Figure 2:
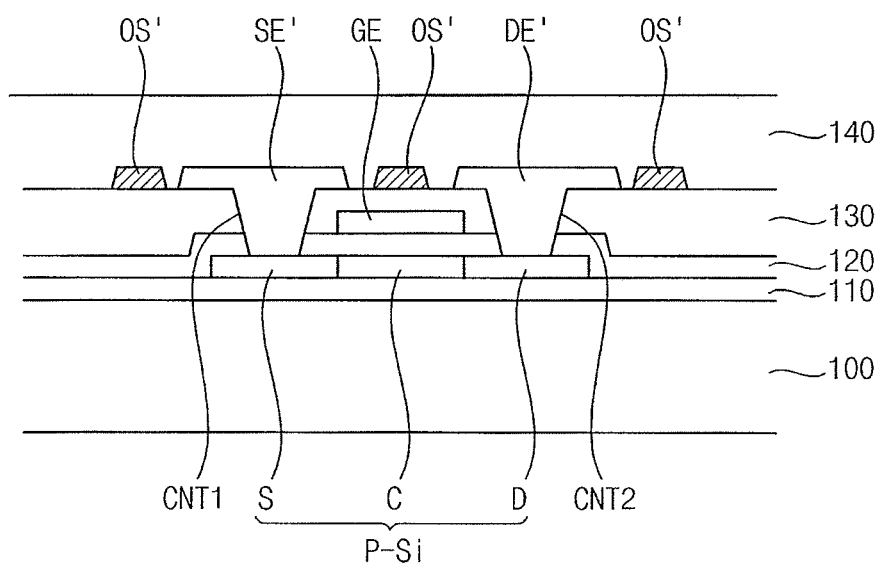
FIG. 2 illustrates a cross-sectional view of a display apparatus according to an example embodiment.

FIG. 2 illustrates a cross-sectional view of a display apparatus according to an example embodiment.

Referring to FIG. 2, the display apparatus may be substantially the same as the display apparatus of FIG. 1 except for aspects of the oxide semiconductor pattern OS', a source electrode SE', and a drain electrode DE'. Therefore, some aspects of the description may not be repeated.

The display apparatus may include the base substrate 100, the buffer layer 110, the polysilicon active pattern p-Si, the first insulation layer 120, the gate electrode GE, the second insulation layer 130, an oxide semiconductor pattern OS', a source electrode SE', a drain electrode DE', and the third insulation layer 140.

The buffer layer 110 may be disposed on the base substrate 100. The polysilicon active pattern p-Si may be disposed on the buffer layer 110. The first insulation layer 120 may be disposed on the buffer layer 110 on which the polysilicon active pattern p-Si is disposed. The gate electrode GE may be disposed on the first insulation layer 120. The second insulation layer 130 may be disposed on the first insulation layer 120 on which the gate electrode GE is disposed. The first contact hole CNT1 exposing the source region of the polysilicon active pattern p-Si and the second contact hole CNT2 exposing the drain region of the polysilicon active pattern p-Si may be formed through the second insulation layer 130.

The oxide semiconductor pattern OS' may be disposed on the second insulation layer 130 between the source electrode SE' and the drain electrode DE', or may be spaced apart from but adjacent to the source electrode SE' or the drain electrode DE'. The oxide semiconductor pattern OS' may be a dummy pattern that is spaced apart from the source electrode SE' and the drain electrode DE' while being disposed adjacent thereto, and the oxide semiconductor pattern OS' may be floated, i.e., electrically floated.

In a process of forming the dummy pattern (described below in connection with, for example, FIGS. 9A-D), the polysilicon active pattern p-Si may be affected by the formation of the oxide semiconductor pattern OS' thereby improving the electron mobility of the polysilicon active pattern p-Si.

The source electrode SE' and the drain electrode DE' may be disposed on the second insulation layer 130 through which the first and second contact holes CNT1 and CNT2 are formed. The source electrode SE' may be electrically connected to the source region S of the polysilicon active pattern p-Si through the first contact hole CNT1. The drain electrode DE' may be electrically connected to the drain region D of the polysilicon active pattern p-Si through the second contact hole CNT2. The third insulation layer 140 may be disposed on the second insulation layer 130 on which the source electrode SE' and the drain electrode DE' are disposed.

The gate electrode GE, the polysilicon active pattern p-Si, the oxide semiconductor pattern OS', the source electrode SE', and the drain electrode DE' may be included in a thin film transistor.

In the present example embodiment, the oxide semiconductor pattern OS' is a dummy pattern that is not electrically connected to the thin film transistor. Thus, a characteristic as a conductor may not be significant for the oxide semiconductor pattern OS' and an additional process to improve the electrical conductivity of the oxide semiconductor pattern OS' may thus be omitted.

Figure 3:
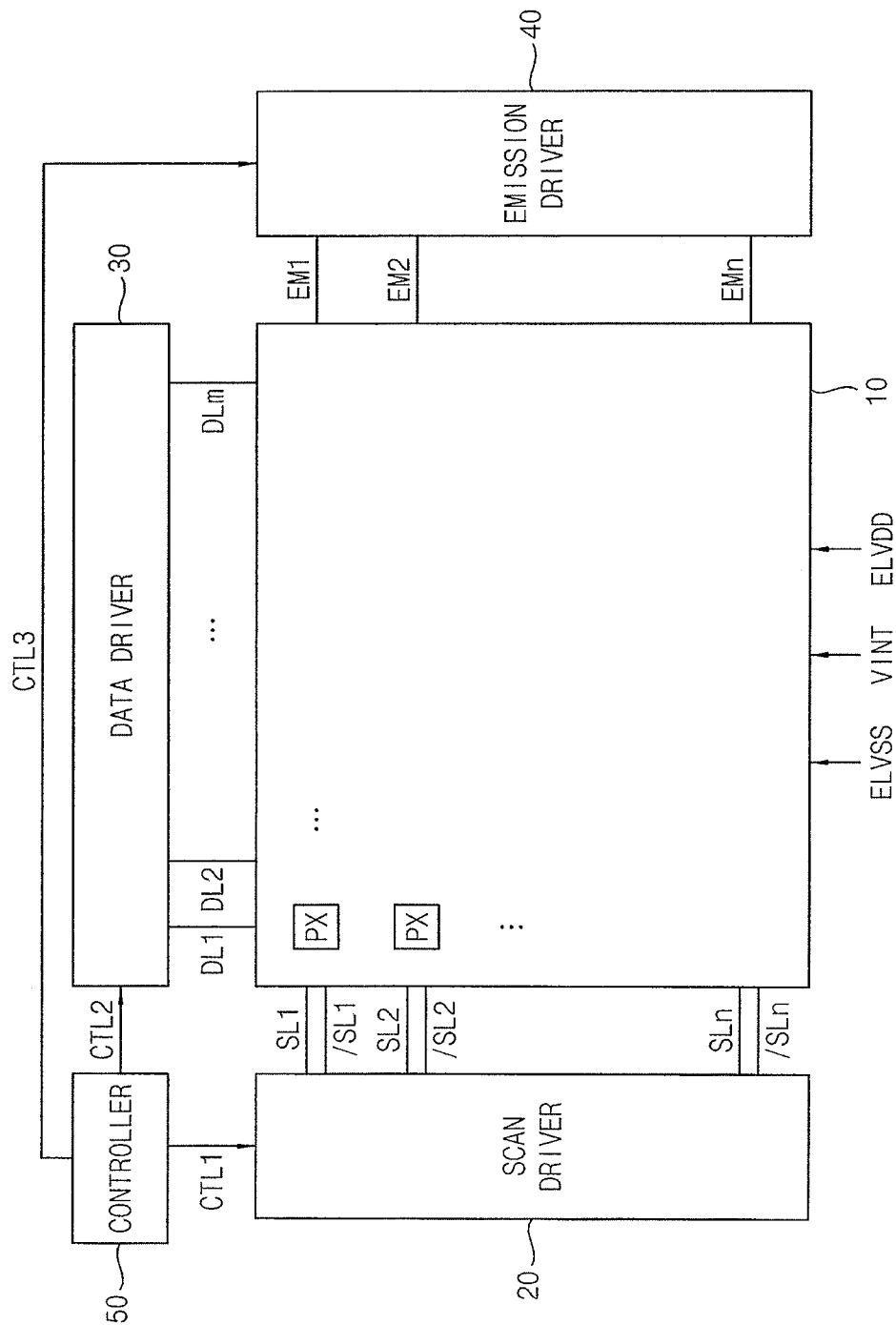
FIG. 3 illustrates a block diagram of a display apparatus according to an example embodiment.

FIG. 3 illustrates a block diagram of a display apparatus according to an example embodiment.

Referring to FIG. 3, the display apparatus may include a display panel 10, a scan driver 20, a data driver 30, an emission control driver 40, and a controller 50.

The display panel 10 may include a plurality of pixels PX to display an image. For example, the display panel 10 may include n*m pixels PX with the pixels PX arranged at locations corresponding to crossing points of the scan lines SL1 through SLn and the data lines DL1 through DLm, where n and m are integers greater than 1. Each of the pixels PX may include a driving transistor and a plurality of switching transistors. The structure of the pixel PX will be described in detail with reference to FIG. 4.

The scan driver 20 may progressively provide a first scan signal to the pixels PX via the scan lines SL1 through SLn based on a first control signal CTL1. The scan driver 20 may progressively provide a second scan signal to the pixels PX via inverted scan lines /SL1 through /SLn based on a first control signal CTL1. For example, the second scan signal may correspond to a signal inverted to the first scan signal.

The data driver 30 may provide a data signal to the pixels PX via the data lines DL1 through DLm based on a second control signal CTL2.

The emission control driver 40 may provide an emission control signal to the pixels PX via the emission control lines EM1 through EMn based on a third control signal CTL3.

The controller 50 may control the scan driver 20, the data driver 30, and the emission control driver 40. The controller 50 may generate the control signals CTL1, CTL2, CTL3 to control the scan driver 20, the data driver 30, and the emission control driver 40. The first control signal CTL1 for controlling the scan driver 20 may include a vertical start signal, scan clock signals, etc. The second control signal CTL2 for the controlling the data driver 30 may include digital image data, a horizontal start signal, etc. The third control signal CTL3 for the controlling the emission control driver 40 may include an emission control start signal, emission control clock signals, etc.

Further, the organic light emitting display apparatus may further include a power supply (not illustrated) providing a first power voltage ELVDD, a second power voltage ELVSS, and an initialization voltage VINT to the display panel 10.

Figure 4:
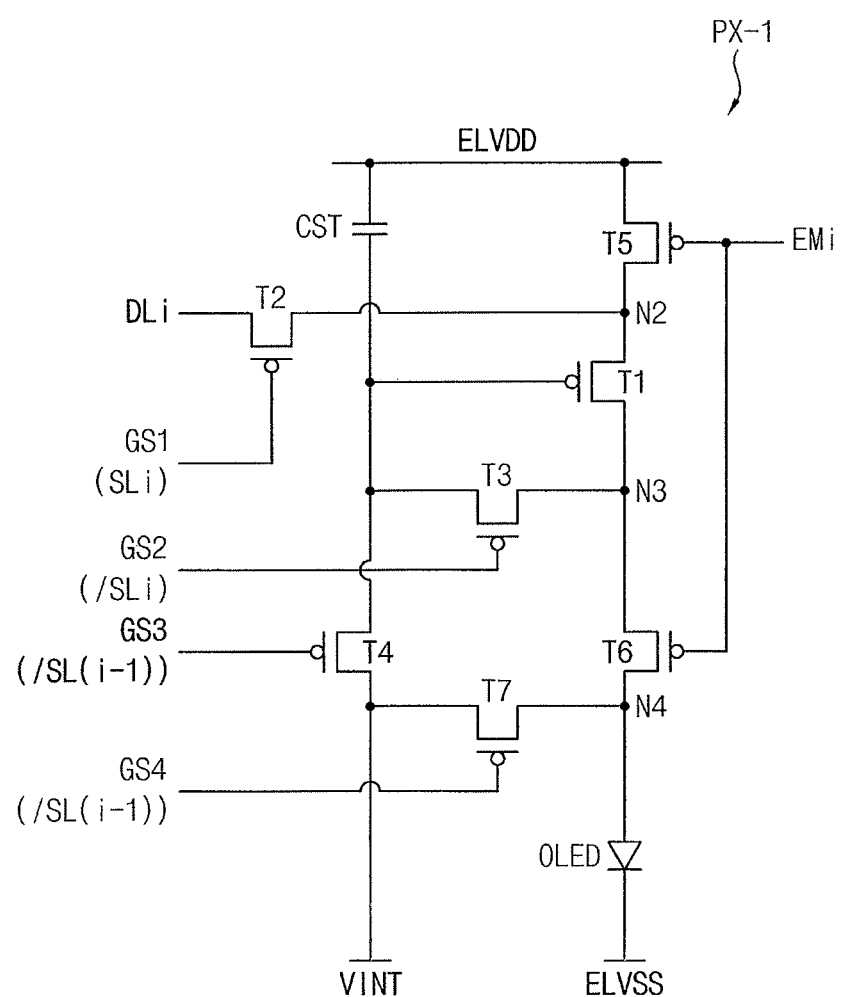
FIG. 4 illustrates a diagram of an example of a pixel included in the display apparatus of FIG. 3.

FIG. 4 illustrates a diagram of an example of a pixel included in the display apparatus of FIG. 3.

Referring to FIG. 4, the pixel PX-1 may include first through seventh transistors T1 through T7, a storage capacitor CST, a first capacitor C1, and an organic light emitting diode OLED. The pixel PX-1 may be located at the (i)th pixel row and the (j)th pixel column, where i is an integer of 1 to n, and j is an integer of 1 to m.

The first transistor T1 may be a driving transistor providing a driving current corresponding to a data signal to the OLED. The first transistor T1 may include a gate electrode connected to the first node N1, a first electrode connected to the second node N2, and a second electrode connected to the third node N3.

The second transistor T2 may provide a data signal to the first transistor T1 in response to a first scan signal GS1. In an example embodiment, the second transistor T2 may include a gate electrode receiving the first scan signal GS1 from the (i)th scan line SLi, a first electrode receiving the data signal from the (j)th data line DLj, and a second electrode connected to the first electrode of the first transistor T1 (i.e., the second node N2).

The third transistor T3 may connect the second electrode of the first transistor T1 to the gate electrode of the first transistor T1 in response to a second scan signal GS2. In an example embodiment, the third transistor T3 may include a gate electrode receiving the second scan signal GS2 from the (i)th inverted scan line /SLi, a first electrode connected to the second electrode of the first transistor T1 (i.e., the third node N3), and a second electrode connected to the gate electrode of the first transistor T1 (i.e., the first node N1).

The fourth transistor T4 may apply the initialization voltage VINT to the gate electrode of the first transistor T1 in response to a third scan signal GS3. In an example embodiment, the fourth transistor T4 may include a gate electrode receiving the third scan signal GS3 from the (i−1)th inverted scan line /SL(i−1), a first electrode receiving an initialization voltage VINT, and a second electrode connected to the gate electrode of the first electrode T1 (i.e., the first node N1).

The fifth transistor T5 may apply the first power voltage ELVDD to the first electrode of the first transistor T1 in response to the emission control signal. In an example embodiment, the fifth transistor T5 may include a gate electrode receiving the emission control signal from the (i)th emission control line EMi, a first electrode receiving the first power voltage ELVDD, and a second electrode connected to the first electrode of the first transistor T1 (i.e., the second node N2).

The sixth transistor T6 may connect the second electrode of the first transistor T1 to the first electrode of the OLED in response to the emission control signal. In an example embodiment, the sixth transistor T6 may include a gate electrode receiving the emission control signal from the (i)th emission control line EMi, a first electrode connected to the second electrode of the first transistor T1 (i.e., the third node N3), and a second electrode connected to the first electrode of the OLED (i.e., a fourth node N4).

The seventh transistor T7 may apply the initialization voltage VINT to the first electrode of the OLED in response to the fourth scan signal GS4. In an example embodiment, the seventh transistor T7 may include a gate electrode receiving the fourth scan signal GS4 from the (i−1)th inverted scan line /SL(i−1), a first electrode receiving the initialization voltage VINT, and a second electrode connected to the first electrode of the OLED (i.e., the fourth node N4).

The third to seventh transistors T3 to T7 may be circuit constituent transistors.

The storage capacitor CST may include a first electrode receiving the first power voltage ELVDD and a second electrode connected to the gate electrode of the first transistor T1 (i.e., the first node N1).

Although the gate electrode of the fourth transistor T4 and the gate electrode of the seventh transistor T7 are shown as being connected to the (i−1)-th reverse scan line /SL (i−1) in FIG. 4, the fourth transistor and the seventh transistor may be connected to separate scan lines, respectively. In this case, the scan driver 20 may include a set of stages for outputting a scan signal, a first scan signal, a second scan signal, a third scan signal, and a fourth scan signal as scan signals, respectively.

In addition, although the pixel PX-1 includes the first to seventh transistors in FIG. 4, the pixel may have various structures. Also, although the transistors are described as including PMOS transistors in this embodiment, NMOS transistors and CMOS transistors may be used.

Figure 5:
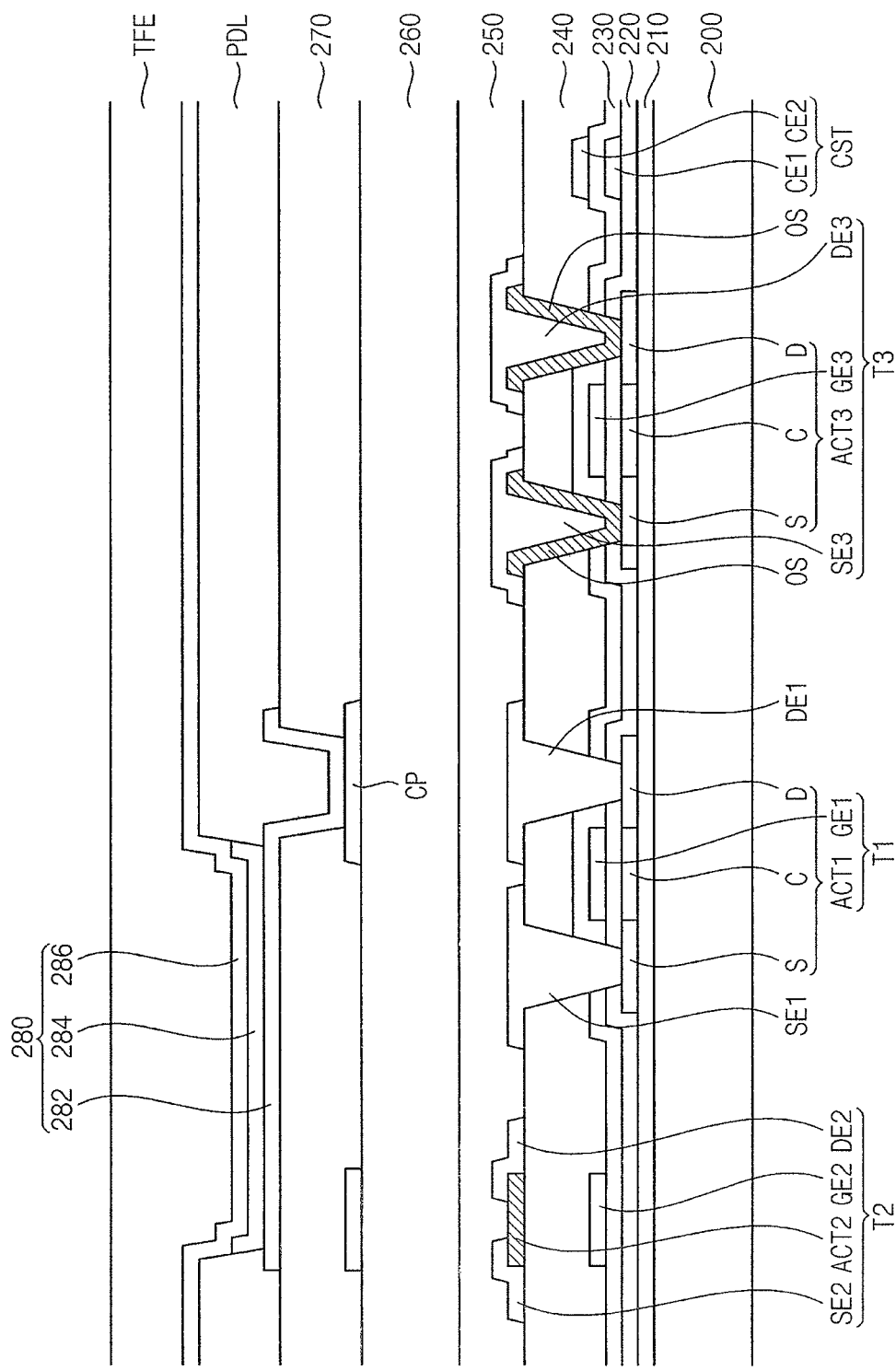
FIG. 5 illustrates a cross-sectional view of a portion corresponding to the pixel of the display apparatus of FIG. 3.

FIG. 5 illustrates a cross-sectional view of a portion corresponding to the pixel of the display apparatus of FIG. 3.

Referring to FIG. 5, the display apparatus may include a base substrate 200, a buffer layer 210, a first active pattern ACT1, a third active pattern ACT3, a first insulation layer 220, a first gate electrode GE1, a third gate electrode GE3, a first storage electrode CE1, a second_first insulation layer 230, a second gate electrode GE2, a second storage electrode CE2, a second_second insulation layer 240, a second active pattern ACT2, an oxide semiconductor pattern OS, a first source electrode SE1, a first drain electrode DE1, a second drain electrode DE2, a third source electrode SE3, a third drain electrode DE2, a third insulation layer 250, a fourth insulation layer 260, a contact pad CP, a fifth insulation layer 270, a light emitting structure 280, and a thin film encapsulation TFE.

The base substrate 200 including transparent or opaque insulation materials may be provided. For example, the base substrate 200 may include a quartz substrate, a synthetic quartz substrate, a calcium fluoride substrate, a fluoride-doped quartz substrate, a sodalime glass substrate, a non-alkali glass substrate etc. In another implementation, the base substrate 200 may include a flexible transparent material such as a flexible transparent resin substrate (e.g., a polyimide substrate).

The buffer layer 210 may be disposed on the base substrate 200. The buffer layer 110 may be disposed on the entirety of the base substrate 200. The buffer layer 210 may prevent the diffusion of metal atoms and/or impurities from the base substrate 200 into the polysilicon active pattern p-Si. In addition, the buffer layer 210 may control a rate of a heat transfer in a crystallization process for forming the polysilicon active pattern p-Si, which may help in obtaining a substantially uniform polysilicon active pattern p-Si.

The first active pattern ACT 1 and the third active pattern ACT 3 may be disposed on the buffer layer 210 and include polycrystalline silicon. Each of the first active pattern ACT1 and the third active pattern ACT3 may include drain and source regions D and S doped with an impurity and a channel region C between the drain region D and the source region S. The polycrystalline silicon may be formed by first depositing amorphous silicon and then crystallizing it.

The third active pattern ACT3 may be formed as a polysilicon pattern influenced by the oxide semiconductor pattern OS, and the electron mobility of the third active pattern ACT3 may be higher than that of the first active pattern ACT1.

The first insulation layer 220 may be disposed on the first and third active patterns ACT1 and ACT3. The first insulation layer 220 may cover the first and third active patterns ACT1 and ACT3. In another implementation, the first insulation layer 220 may have a substantially flat upper surface without a step around the first and third active patterns ACT1 and ACT3. The first insulation layer 220 may include a silicon compound, a metal oxide, etc.

The first storage electrode CE1, the first gate electrode GE1, and the third gate electrode GE3 may be disposed on the first insulation layer 220. The first gate electrode GE1 may be disposed to overlap the first active pattern ACT1. The third gate electrode GE3 may be disposed to overlap the third active pattern ACT3. The first storage electrode CE1, the first gate electrode GE1, and the third gate electrode GE3 may be included in a first gate pattern. The first gate pattern may further include a signal line such as a first gate line for driving the display apparatus. The first gate pattern may be formed using a metal, an alloy, a metal nitride, a conductive metal oxide, a transparent conductive material, or the like.

The second_first insulation layer 230 may be disposed on the first gate pattern. For example, the second_first insulation layer 230 may cover the first gate pattern on the first insulation layer 220, and may be disposed as a substantially uniform thickness along a profile of the first gate pattern. The second_first insulation layer 230 may include a silicon compound, a metal oxide, etc.

The second storage electrode CE2 and the second gate electrode GE2 may be disposed on the second_first insulation layer 230. The second storage electrode CE2 may overlap the first storage electrode CE1 to form a storage capacitor. The second storage electrode CE2 and the second gate electrode GE2 may be included in a second gate pattern. The second gate pattern may further include a signal line such as a second gate line for driving the display apparatus. The second gate pattern may be formed using a metal, an alloy, a metal nitride, a conductive metal oxide, a transparent conductive material, or the like.

The second_second insulation layer 240 may be disposed on the second gate pattern. The second_second insulation layer 240 may be formed of a plurality of layers and may include a layer containing silicon oxide ($SiO_x$).

The second active pattern ACT2 and the oxide semiconductor pattern OS may be disposed on the second_second insulation layer 240. The second active pattern ACT2 may be disposed to overlap the second gate electrode GE2. The second active pattern ACT2 may include an oxide semiconductor. Thus, the second active pattern ACT2 may include an oxide semiconductor layer including, for example, a two-component compound ($AB_x$), ternary compound ($AB_xC_y$), four-component compound ($AB_xC_yD_z$), etc. These compounds contain indium (In), zinc (Zn), gallium (Ga), tin (Sn), titanium (Ti), aluminum (Al), hafnium (Hf), zirconium (Zr), magnesium (Mg), etc. For example, the oxide semiconductor pattern OS may include at least one of zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), etc.

The oxide semiconductor pattern OS may include an oxide semiconductor. The oxide semiconductor pattern OS may be formed in contact holes that are formed through the first insulation layer 220, the second_first insulation layer 230, and the second_second insulation layer 240 and expose the source region S and the drain region D of the third active pattern ACT3.

Electrical conductivity of the oxide semiconductor pattern OS may be higher than that of the second active pattern ACT2.

The first source electrode SE1, the first drain electrode DE1, the second source electrode SE2, the second drain electrode DE2, the third source electrode SE3, the third drain electrode DE3 may be disposed on the second_first insulation layer 230 on which the oxide semiconductor pattern OS and the third active pattern ACT3 are disposed. The first source electrode SE1 and the first drain electrode DE1 may be electrically connected to the source region S and the drain region D of the first active pattern ACT1 through contact holes that are formed through the first insulation layer 220, the second_first insulation layer 230, and the second_second insulation layer 240 and expose the source region S and the drain region D of the first active pattern ACT1. The second source electrode SE2 and the second drain electrode DE2 may be electrically connected to the second active pattern ACT2. The third source electrode SE3 and the third drain electrode DE3 may be electrically connected to the source region S and the drain region D of the third active pattern ACT3 through the oxide semiconductor pattern OS.

The first source electrode SE1, the first drain electrode DE1, the second source electrode SE2, the second drain electrode DE2, the third source electrode SE3, and the third drain electrode DE3 may be included in a first source/drain pattern. The first source/drain pattern may further include a signal line such as a first data line for driving the display apparatus. The first source/drain pattern may be formed using, for example, a metal, an alloy, a metal nitride, a conductive metal oxide, a transparent conductive material, or the like.

The first active pattern ACT1, the first gate electrode GE1, the first source electrode SE1, and the first drain electrode DE1 may be included in a first thin film transistor T1. The second active pattern ACT2, the second gate electrode GE2, the second source electrode SE2, and the second drain electrode DE2 may be included in a second thin film transistor T2. The third active pattern ACT3, the third gate electrode GE3, the third source electrode SE3, and the third drain electrode DE3 may be included in a third thin film transistor T3.

The third insulation layer 250 may be disposed on the second active pattern ACT2 and the first source/drain pattern. For example, the third insulation layer 250 may cover the second active pattern ACT2 and the first source/drain pattern on the second_second insulation layer 240, and may be disposed as a substantially uniform thickness along a profile of the second active pattern ACT2 and the first source/drain pattern. In an example embodiment, the third insulation layer 250 may cover the second active patterns ACT2 and the first source/drain pattern on the second_second insulation layer 240, and may have a substantially flat upper surface without a step around the second active patterns ACT2 and the first source/drain pattern. The third insulation layer 250 may include, for example, a silicon compound, a metal oxide, etc.

In an example embodiment, the third insulation layer 250 may be composed of silicon oxide and may directly contact an upper surface of the second active pattern ACT2. Thus, the interface characteristics of the second active pattern ACT2 may be relatively improved. This also applies to the case of the second insulation layer 240.

The fourth insulation layer 260 may be disposed on the third insulation layer 250. The fourth insulation layer 260 may have a single-layer structure or a multi-layer structure including at least two insulation layers, etc. In an example embodiment, the fourth insulation layer 260 may include an organic material such as one or more of a polyimide, a epoxy-based resin, an acryl-based resin, a polyester, a photoresist, a polyacryl-based resin, a polyimide-based resin, a polyamide-based resin, a siloxane-based resin, etc. In an example embodiment, the fourth insulation layer 260 may be formed using an inorganic material such as a silicon compound, a metal, a metal oxide, or the like.

The contact pad CP may be disposed on the fourth insulation layer 260. The contact pad CP may be electrically connected to the first thin film transistor T1 through a via formed through the third insulation layer 250 and the fourth insulation layer 260 and other circuit structures. The contact pad CP may be included in a second source/drain pattern. The second source/drain pattern may further include a signal line such as a second data line for driving the display apparatus. The second source/drain pattern may be formed using, for example, a metal, an alloy, a metal nitride, a conductive metal oxide, a transparent conductive material, or the like.

The fifth insulation layer 270 may be disposed on the fourth insulation layer 260 on which the contact pad CP is disposed. The fifth insulation layer 270 may have a single-layer structure or a multi-layer structure including at least two insulation layers, etc. In an example embodiment, the fifth insulation layer 270 may include an organic material such as one or more of a polyimide, an epoxy-based resin, an acryl-based resin, a polyester, a photoresist, a polyacryl-based resin, a polyimide-based resin, a polyamide-based resin, a siloxane-based resin, etc. In an example embodiment, the fifth insulation layer 270 may be formed using an inorganic material such as a silicon compound, a metal, a metal oxide, or the like.

The light emitting structure 280 may include a first electrode 282, a light emitting layer 284, and a second electrode 286.

The first electrode 282 may be disposed on the fifth insulation layer 270. The first electrode 282 may be electrically connected to the contact pad CP through a contact hole formed through the fifth insulation layer 270.

The first electrode 282 may include a reflective material or a transmissive material in accordance with the emission type of the display apparatus. For example, the first electrode 282 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In an example embodiment, the first electrode 282 may have a single layer structure or a multi layer structure, which may include a metal film, an alloy film, a metal nitride film, a conductive metal oxide film and/or a transparent conductive film.

The pixel defining layer PDL may be disposed on the fifth insulation layer 270 on which the first electrode 282 is disposed. The pixel defining layer PDL may be formed using an organic material. For example, the pixel defining layer PDL may include a photoresist, an acryl-based resin, a polyimide-based resin, a polyamide-based resin, a siloxane-based resin, etc. In an example embodiment, an opening that exposes the first electrode 282 may be formed by etching the pixel defining layer PDL.

The light emitting layer 284 may be disposed on the first electrode 282 exposed through the opening of the pixel defining layer PDL. The light emitting layer 284 may extend on a sidewall of the opening of the pixel defining layer PDL. In an example embodiment, the light emitting layer 284 may include an organic light emitting layer (EL), a hole injection layer (HIL), a hole transfer layer (HTL), an electron transfer layer (ETL), an electron injection layer (EIL), etc. In an example embodiment, the hole injection layer, the hole transport layer, the electron transport layer, and the electron injection layer may be formed in common to correspond to a plurality of pixels. In an example embodiment, a plurality of organic light emitting layers may be formed using light emitting materials for generating different colors of light, such as a red color of light, a green color of light and a blue color of light in accordance with color pixels of the display device. In an example embodiment, the organic light emitting material of the of the light emitting layer 284 may include a plurality of stacked light emitting materials for generating a red color of light, a green color of light and a blue color of light to thereby emitting a white color of light. Elements of the light emitting layer 284 may be commonly formed so as to correspond to a plurality of pixels, and each pixel may be delineated by a color filter layer.

The second electrode 286 may be disposed on the pixel defining layer PDL and the light emitting layer 284. The second electrode 286 may include a transmissive material or a reflective material in accordance with the emission type of the display device. For example, the second electrode 286 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In an example embodiment, the second electrode 286 may have a single layer structure or a multi layer structure, which may include a metal film, an alloy film, a metal nitride film, a conductive metal oxide film and/or a transparent conductive film.

The thin film encapsulation layer TFE may be disposed on the second electrode 286. The thin film encapsulation layer TFE may prevent penetration of moisture and oxygen from outside. The thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer therebetween, etc. In an example embodiment, a sealing substrate for shielding outside air and moisture from penetrating into the display apparatus may be provided instead of the thin film encapsulation layer TFE.

The first thin film transistor T1 may be a driving transistor (refer to T1 of FIG. 4). The second thin film transistor T2 may be a switching transistor (refer to T2 of FIG. 4). The third thin film transistor T3 may be a circuit configuration transistor (refer to T3 to T7 or FIG. 4).

In an example embodiment, the first thin film transistor T1 is a polysilicon transistor having a large DR and used as a driving transistor (refer to T1 in FIG. 4), the second thin film transistor T2 is an oxide semiconductor transistor having a good switching characteristic and used as a switching transistor (refer to T2 in FIG. 4), and the third thin film transistor T3 is a polysilicon transistor having improved electric mobility and used as a circuit constituting transistor (refer to T3 to T7 in FIG. 4), so that display quality of the display apparatus can be improved.

Figure 6:
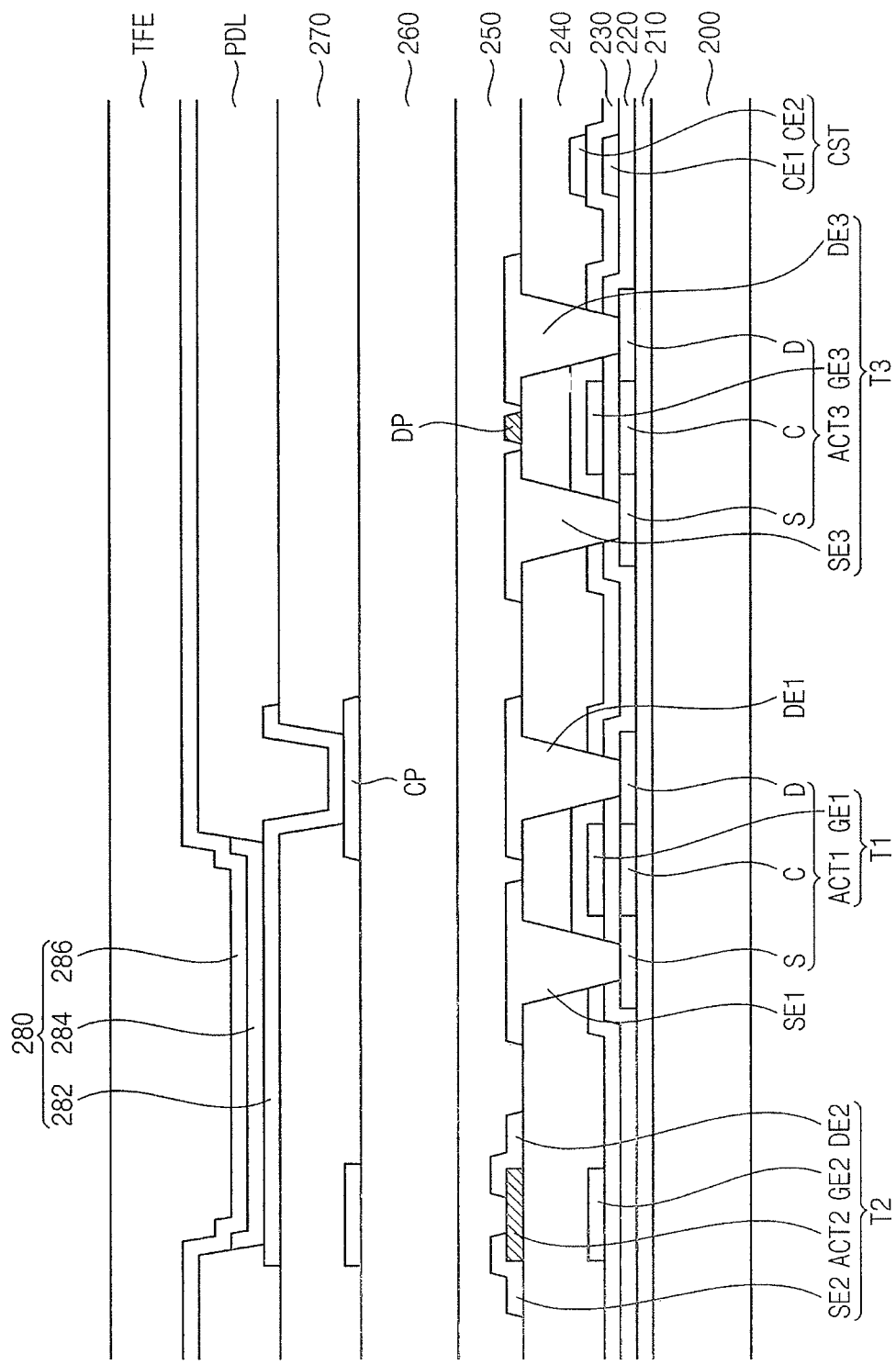
FIG. 6 illustrates a cross-sectional view of a portion corresponding to a pixel of a display apparatus according to an example embodiment.

FIG. 6 illustrates a cross-sectional view of a portion corresponding to a pixel of a display apparatus according to an example embodiment.

Referring to FIG. 6, the display apparatus may be substantially the same as the display apparatus of FIG. 5 except that an oxide semiconductor pattern is formed as a dummy pattern on the second_second insulation layer instead of being formed in the contact holes. Therefore, some aspects of the description may not be repeated.

The display apparatus may include the base substrate 200, the buffer layer 210, the first active pattern ACT1, the third active pattern ACT3, the first insulation layer 220, the first gate electrode GE1, the third gate electrode GE3, the first storage electrode CE1, the second_first insulation layer 230, the second gate electrode GE2, the second storage electrode CE2, the second_second insulation layer 240, the second active pattern ACT2, a dummy pattern DP, the first source electrode SE1, the first drain electrode DE1, the second drain electrode DE2, the third source electrode SE3, the third drain electrode DE2, the third insulation layer 250, the fourth insulation layer 260, the contact pad CP, the fifth insulation layer 270, the light emitting structure 280, and the thin film encapsulation TFE.

According to the present example embodiment, the dummy pattern DP is an oxide semiconductor pattern and may include an oxide semiconductor. The dummy pattern DP may be disposed on the second insulation layer 240 between the third source electrode SE and the third drain electrode DE3. Thus, the dummy pattern DP may be spaced apart from, e.g., separated from, the third source electrode SE3 or the third drain electrode DE3, while being adjacent to the third source electrode SE3 or the third drain electrode DE3. The dummy pattern may be floated.

Figure 7:
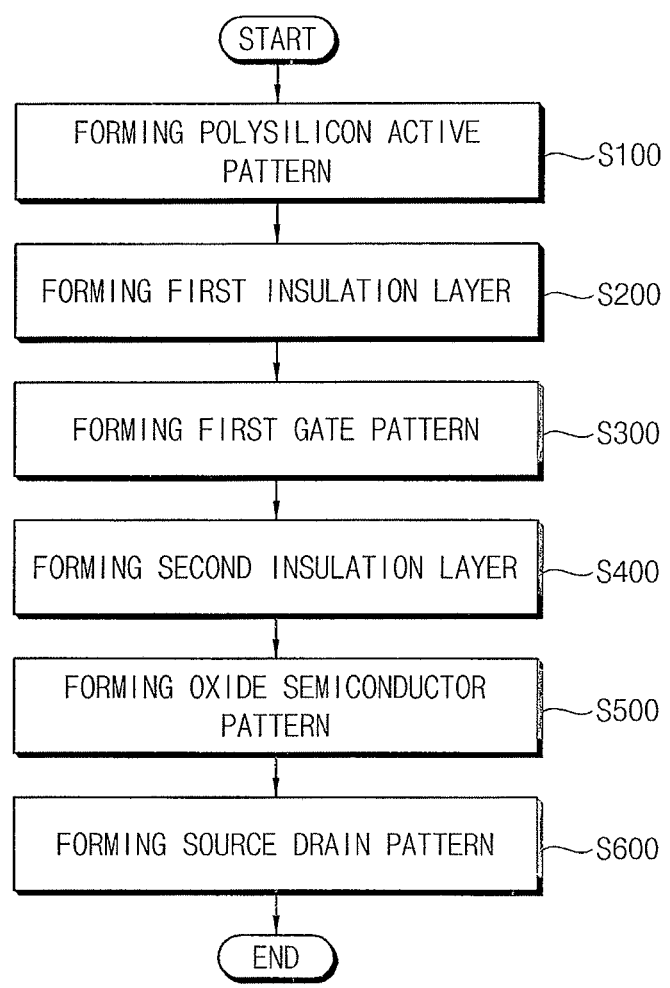
FIG. 7 illustrates a flowchart of a method of manufacturing a display apparatus according to an example embodiment.

FIG. 7 illustrates a flowchart of a method of manufacturing a display apparatus according to an example embodiment.

Referring to FIG. 7, the method of manufacturing the display apparatus according to the present example embodiment may include forming a polysilicon active pattern (S100), forming a first insulation layer (S200), forming a first gate pattern (S300), forming a second insulation layer (S400), forming an oxide semiconductor pattern (S500), and forming a source/drain pattern (S600).

In forming the polysilicon active pattern (S100), a polysilicon active pattern including polycrystalline silicon may be formed on the base substrate. For example, a buffer layer may be formed on the base substrate. Thereafter, an amorphous silicon layer may be formed on the buffer layer. Then, the amorphous silicon layer may be crystallized to form a polysilicon layer. Then, the polysilicon layer may be patterned by photolithography or the like to form the polysilicon active pattern.

In forming the first insulation layer (S200), a first insulation layer may be formed on the base substrate on which the polysilicon active pattern is formed. The first insulation layer may be formed by, for example, a chemical vapor deposition (CVD) process, a spin coating process, a plasma enhanced chemical vapor deposition (PECVD) process, a sputtering process, a vacuum evaporation process, a high density plasma-chemical vapor deposition (HDP-CVD) process, a printing process, etc.

In forming the first gate pattern (S300), a first gate pattern including a first gate electrode may be formed on the first insulation layer. A conductive layer may be formed on the first insulation layer, and then the conductive layer may be partially etched by a photolithography process or an etching process using an additional etching mask to provide the first gate pattern. The conductive layer may be formed by, for example, a printing process, a sputtering process, a CVD process, a pulsed laser deposition (PLD) process, a vacuum evaporation process, an atomic layer deposition (ALD) process, etc.

The method may further include doping the polysilicon active pattern with an impurity to form a source region and a drain region of the polysilicon active pattern after forming the first gate pattern.

In forming the second insulation layer (S400), a second insulation layer may be formed on the first insulation layer on which the first gate electrode is formed. For example, a second_first insulation layer may be formed on the first insulation layer on which the first gate electrode is formed. A second gate pattern including a second gate electrode and an oxide gate electrode may be formed on the second_first insulation layer. A second_second insulation layer may be formed on the second gate pattern. A contact hole may be formed through the second_second insulation layer, the second_first insulation layer, and the first insulation layer.

The first insulation layer, the second_first insulation layer, and the second_second insulation layer may be formed by, for example, a CVD process, a spin coating process, a PECVD process, a sputtering process, a vacuum evaporation process, a HDP-CVD process, a printing process, etc. A conductive layer may be formed, and then the conductive layer may be partially etched by a photolithography process or an etching process using an additional etching mask to form the second gate pattern. The conductive layer may be formed by, for example, a printing process, a sputtering process, a CVD process, a PLD process, a vacuum evaporation process, an ALD process, etc.

The method may further include forming a contact hole that exposes the polysilicon active pattern through the first insulation layer and the second insulation layer (the second_first and second_second insulation layers).

The method may further include performing a treatment for dopant activation of the polysilicon active pattern.

In forming the oxide semiconductor pattern (S500), an oxide semiconductor pattern may be formed on the second insulation layer. An oxide semiconductor layer may be formed, and then the oxide semiconductor layer may be partially etched by a photolithography process or an etching process using an additional etching mask to provide the oxide semiconductor pattern.

The method may further include annealing by heating the oxide semiconductor layer or the oxide semiconductor pattern. For example, the oxide semiconductor pattern may be heated at about 360 degrees Celsius.

The oxide semiconductor pattern may be formed in the contact hole, and may contact the source electrode and the source region, or may contact the drain electrode and the drain region.

In an example embodiment, the oxide semiconductor pattern may be a dummy pattern disposed between the source electrode and the drain electrode and floated on the second insulation layer.

In an implementation, the method may further include a process such as a plasma treatment for increasing the electrical conductivity of the oxide semiconductor pattern.

In forming the source/drain pattern (S600), a source electrode and a drain electrode may be formed on the second insulation layer on which the oxide semiconductor pattern is formed. The source electrode and the drain electrode may be electrically connected to the source region and the drain region of the polysilicon active pattern through the contact hole, respectively.

Thereafter, the display apparatus may be manufactured by forming a plurality of insulation layers, a light emitting structure, and the like.

FIGS. 8A to 8D illustrate cross-sectional views of stages in a method of manufacturing the display apparatus of FIG. 1.

Figure 8A:
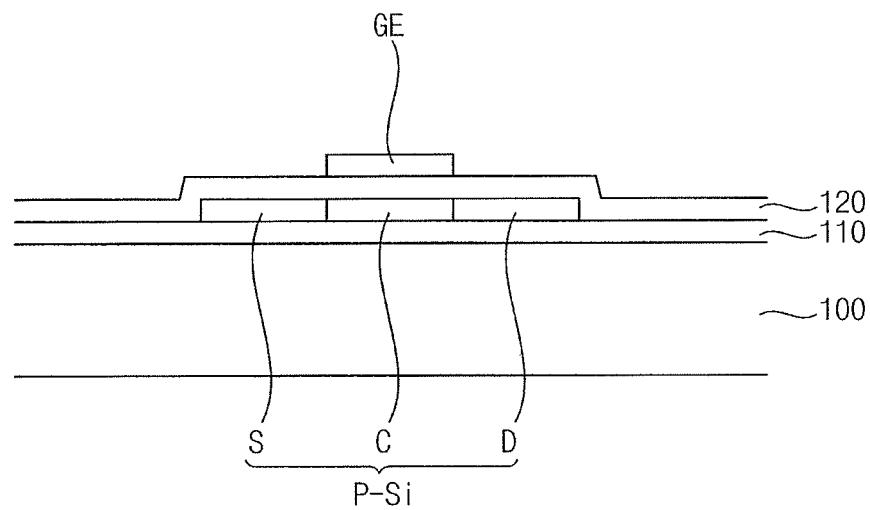
FIGS. 8A to 8D illustrate cross-sectional views of stages in a method of manufacturing the display apparatus of FIG. 1.

Referring to FIG. 8A, the buffer layer 110 may be formed on the base substrate 100. A polysilicon layer may be formed on the buffer layer 110. The polysilicon layer may be patterned to form the polysilicon active pattern p-Si. The first insulation layer 120 may be formed on the buffer layer 110 on which the polysilicon active pattern p-Si is formed. The gate electrode GE may be formed on the first insulation layer 120.

Figure 8B:
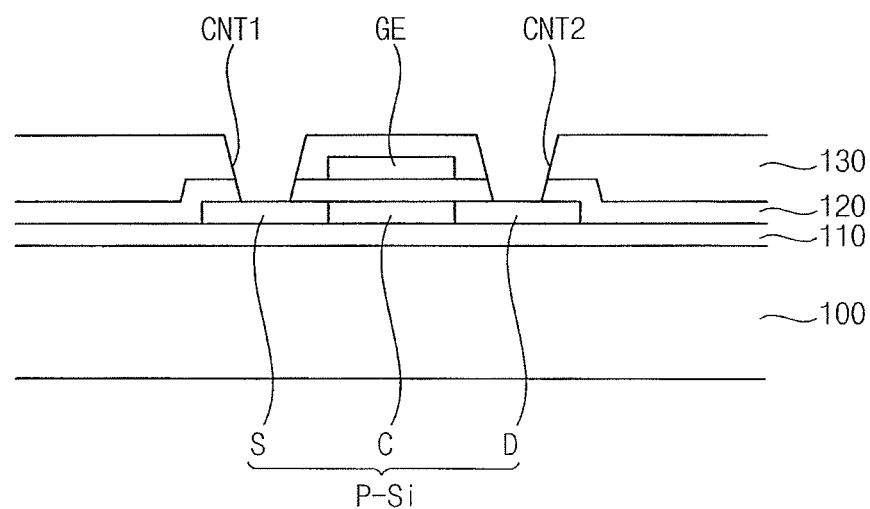

Referring to FIG. 8B, the source region S, the drain region D, and the channel region C of the polysilicon active pattern p-Si may be formed by implanting impurities into the polysilicon active pattern p-Si. The second insulation layer 130 may be formed on the first insulation layer 120 on which the gate electrode GE is disposed. First and second contact holes CNT1 and CNT2 that expose the source and drain regions S and D of the polysilicon active pattern p-Si may be formed through the second insulation layer 130 and the first insulation layer 120.

Figure 8C:
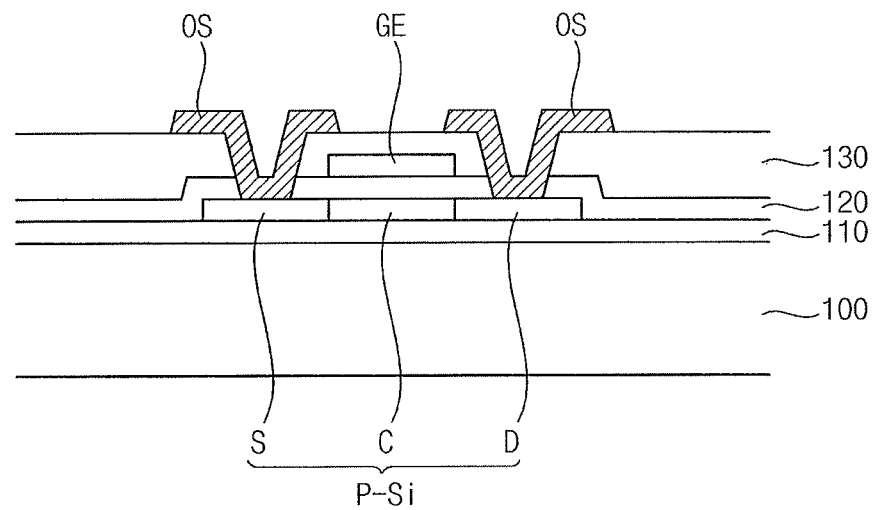

Referring to FIG. 8C, an oxide semiconductor layer may be formed on the second insulation layer 130 through which the first and second contact holes CNT1 and CNT2 are formed. The oxide semiconductor pattern OS may be formed by patterning the oxide semiconductor layer. An annealing process of heating the oxide semiconductor layer or the oxide semiconductor pattern OS may be performed. Thereafter, a process such as a plasma treatment for improving electrical conductivity of the oxide semiconductor pattern OS may be performed.

Figure 8D:
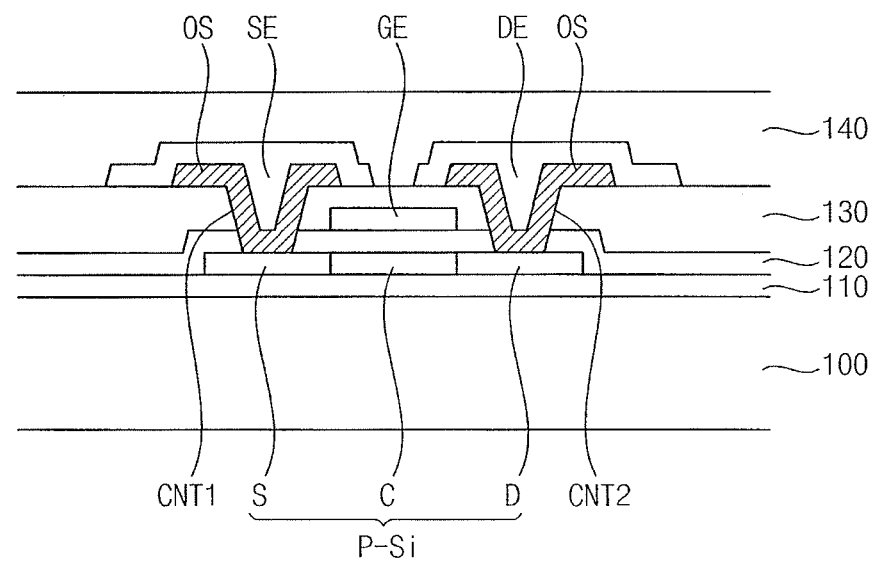

Referring to FIG. 8D, after a conductive layer is formed on the oxide semiconductor pattern OS, the conductive layer may be patterned to form the source electrode SE and the drain electrode DE. The third insulation layer 140 may be formed on the source electrode SE and the drain electrode DE.

FIGS. 9A to 9D illustrate cross-sectional views of stages in a method of manufacturing the display apparatus of FIG. 2.

Figure 9A:
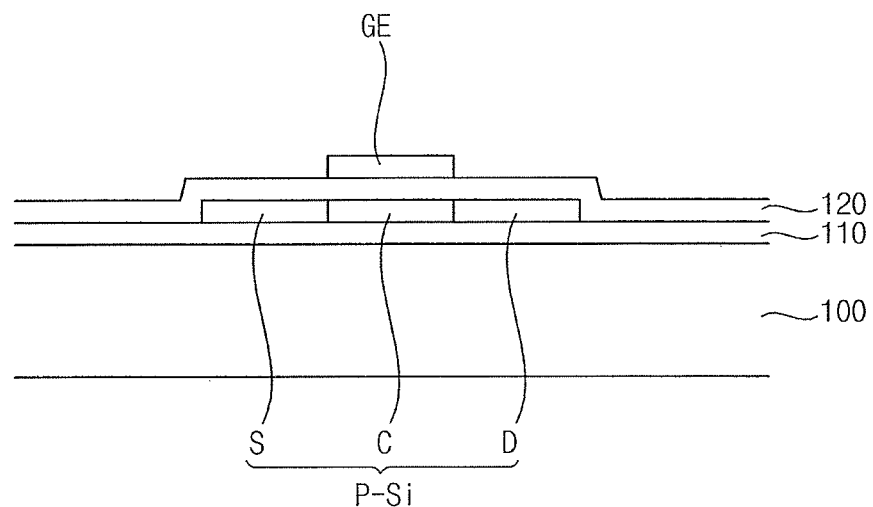
FIGS. 9A to 9D illustrate cross-sectional views of stages in a method of manufacturing the display apparatus of FIG. 2.

Referring to FIG. 9A, the buffer layer 110 may be formed on the base substrate 100. A polysilicon layer may be formed on the buffer layer 110. The polysilicon layer may be patterned to form the polysilicon active pattern p-Si. The first insulation layer 120 may be formed on the buffer layer 110 on which the polysilicon active pattern p-Si is formed. The gate electrode GE may be formed on the first insulation layer 120.

Figure 9B:
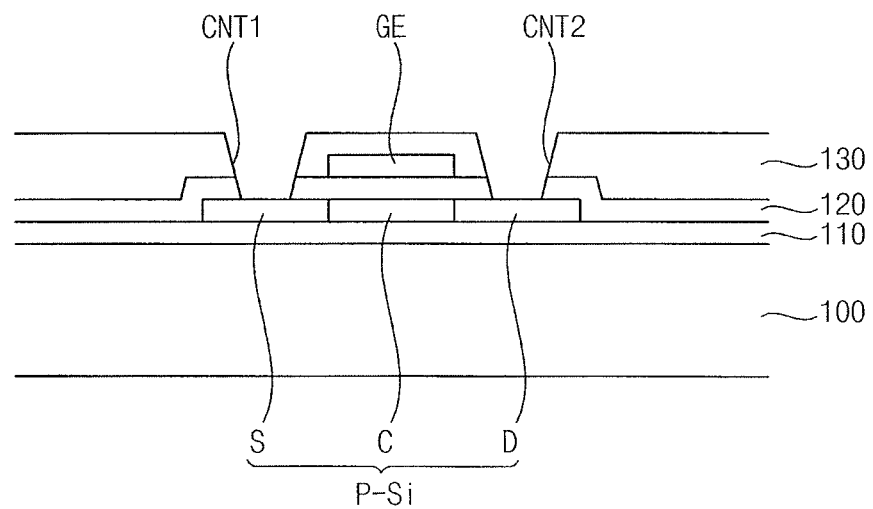

Referring to FIG. 9B, the source region S, the drain region D, and the channel region C of the polysilicon active pattern p-Si may be formed by implanting impurities into the polysilicon active pattern p-Si. The second insulation layer 130 may be formed on the first insulation layer 120 on which the gate electrode GE is disposed. First and second contact holes CNT1 and CNT2 that expose the source and drain regions S and D of the polysilicon active pattern p-Si may be formed through the second insulation layer 130 and the first insulation layer 120.

Figure 9C:
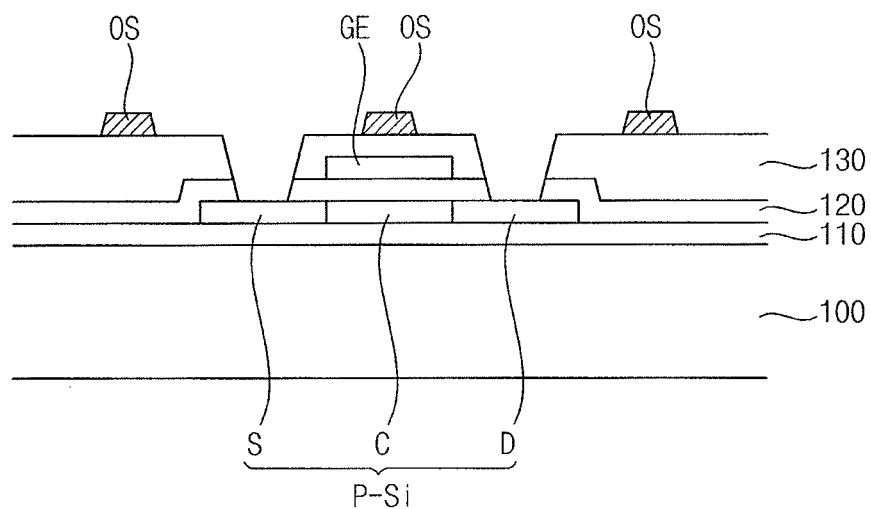

Referring to FIG. 9C, an oxide semiconductor layer may be formed on the second insulation layer 130 through which the first and second contact holes CNT1 and CNT2 are formed, such that the oxide semiconductor layer fills the first and second contact holes CNT1 and CNT2 and makes contact with the source region S and the drain region of the polysilicon active pattern p-Si (see FIG. 8C). The oxide semiconductor pattern OS may be formed by patterning the oxide semiconductor layer. An annealing process of heating the oxide semiconductor layer or the oxide semiconductor pattern OS may be performed.

Figure 9D:
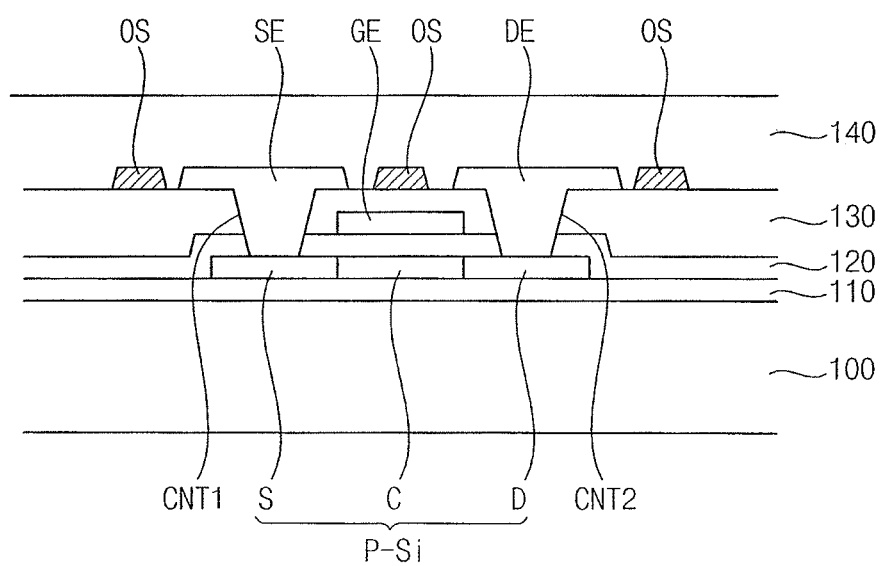

Referring to FIG. 9D, a conductive layer may be formed on the second insulation layer 130, and then the conductive layer may be patterned to form the source electrode SE and the drain electrode DE. The third insulation layer 140 may be formed on the source electrode SE and the drain electrode DE.

FIGS. 10A to 10E illustrate cross-sectional views of stages in a method of manufacturing the display apparatus of FIG. 5.

Figure 10A:
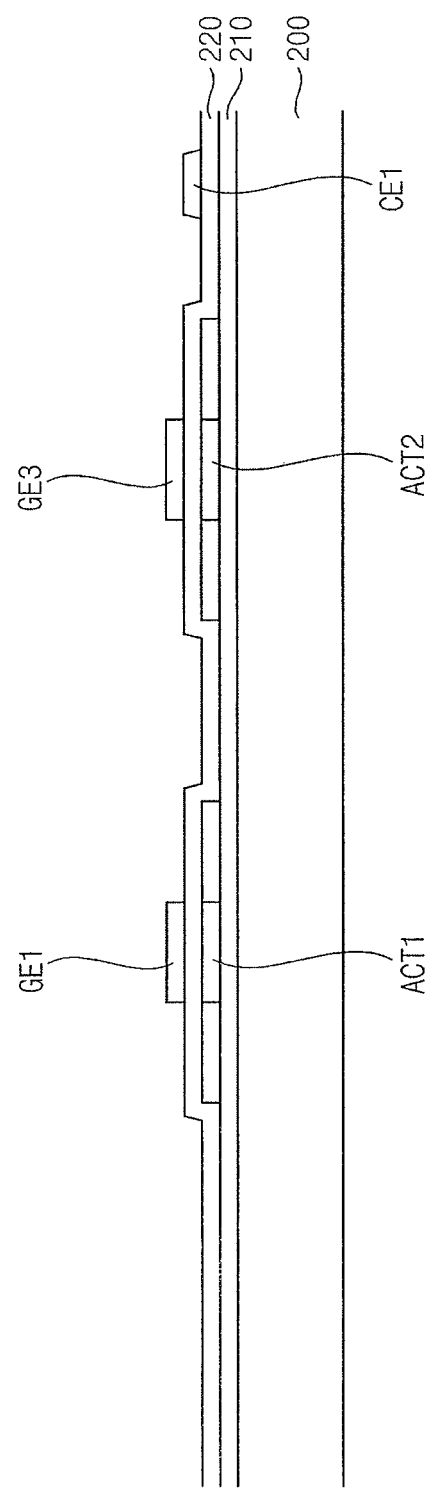
FIGS. 10A to 10E illustrate cross-sectional views of stages in a method of manufacturing the display apparatus of FIG. 5.

Referring to FIG. 10A, the buffer layer 210 may be formed on the base substrate 200. An active layer may be formed on the buffer layer 210. The active layer may be patterned to form the first active pattern ACT1 and the third active pattern ACT3. The first insulation layer 220 may be formed on first and third active patterns ACT1 and ACT3. The gate electrode GE may be formed on the first insulation layer 120. A first gate pattern including the first gate electrode GE1, the first storage electrode CE1, and the third gate electrode GE3 may be formed on the first insulation layer 220.

Figure 10B:
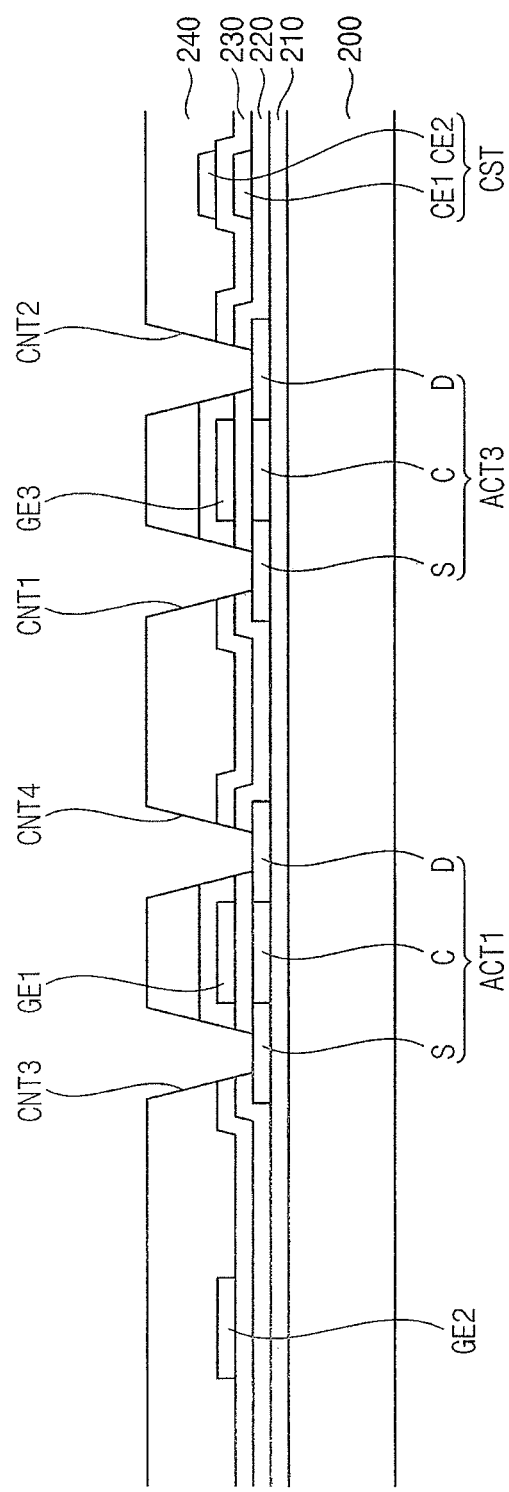

Referring to FIG. 10B, the second_first insulation layer 230 may be formed on the first insulation layer 220 on which the first gate pattern is formed. A second gate pattern including the second storage electrode CE2 and the second gate electrode GE2 may be formed on the second_first insulation layer 230. The second_second insulation layer 240 may be formed on the second gate pattern. First to fourth contact holes CNT1 to CNT4 that expose the third active pattern ACT3 and the first active pattern ACT1 may be formed through the second_second insulation layer 240, the second_first insulation layer 230, and the first insulation layer 220.

Figure 10C:
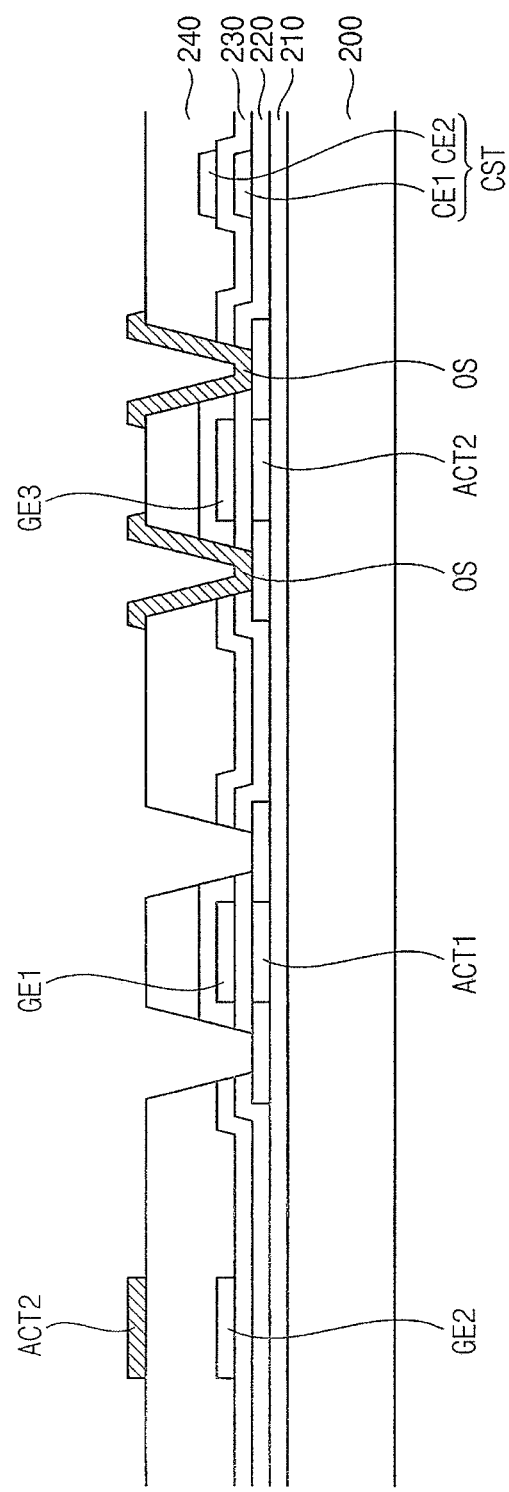

Referring to FIG. 10C, an oxide semiconductor layer may be formed on the second_second insulation layer 240 through which the first to fourth contact holes CNT1 to CNT4 are formed. The second active pattern ACT2 and the oxide semiconductor pattern OS may be formed by patterning the oxide semiconductor layer. An annealing process of heating the oxide semiconductor layer or the oxide semiconductor pattern may be performed. Thereafter, a process such as a plasma treatment for improving electrical conductivity of the oxide semiconductor pattern OS may be performed.

Figure 10D:
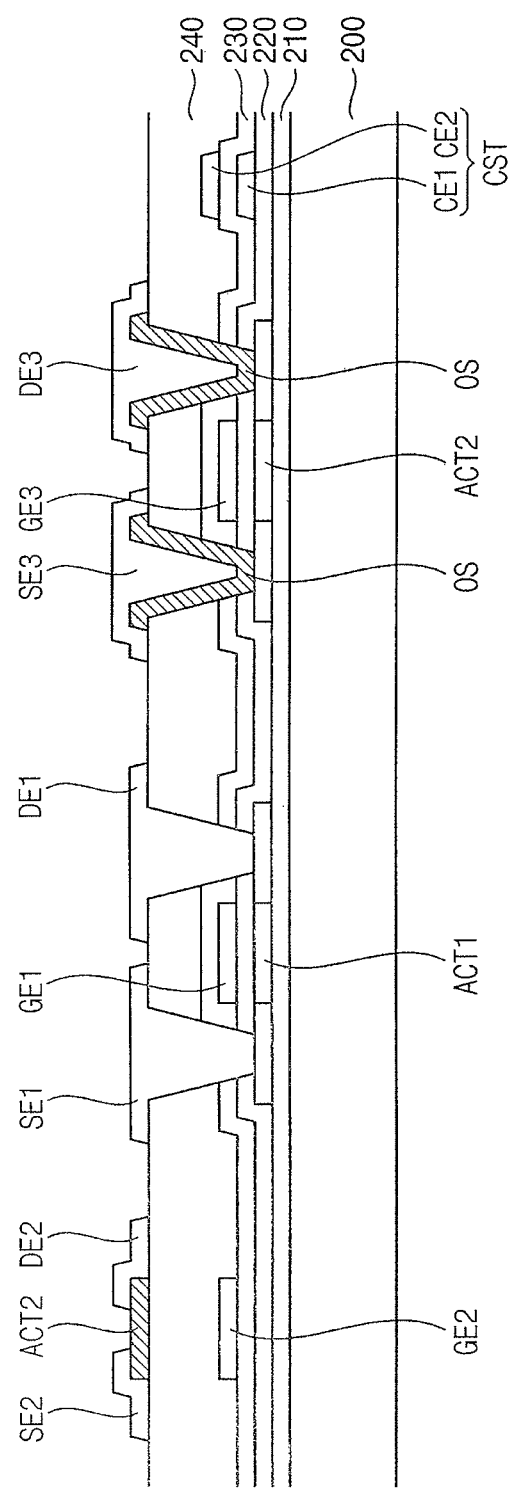

Referring to FIG. 10D, after a conductive layer is formed on the second_second insulation layer 240 on which the second semiconductor pattern ACT2 and the oxide semiconductor pattern OS are formed, a first source/data pattern including the first source electrode SE1, the first drain electrode DE1, the second source electrode SE2, the second drain electrode DE2, the third source electrode SE3, and the third drain electrode DE3 may be formed by patterning the conductive layer.

Figure 10E:
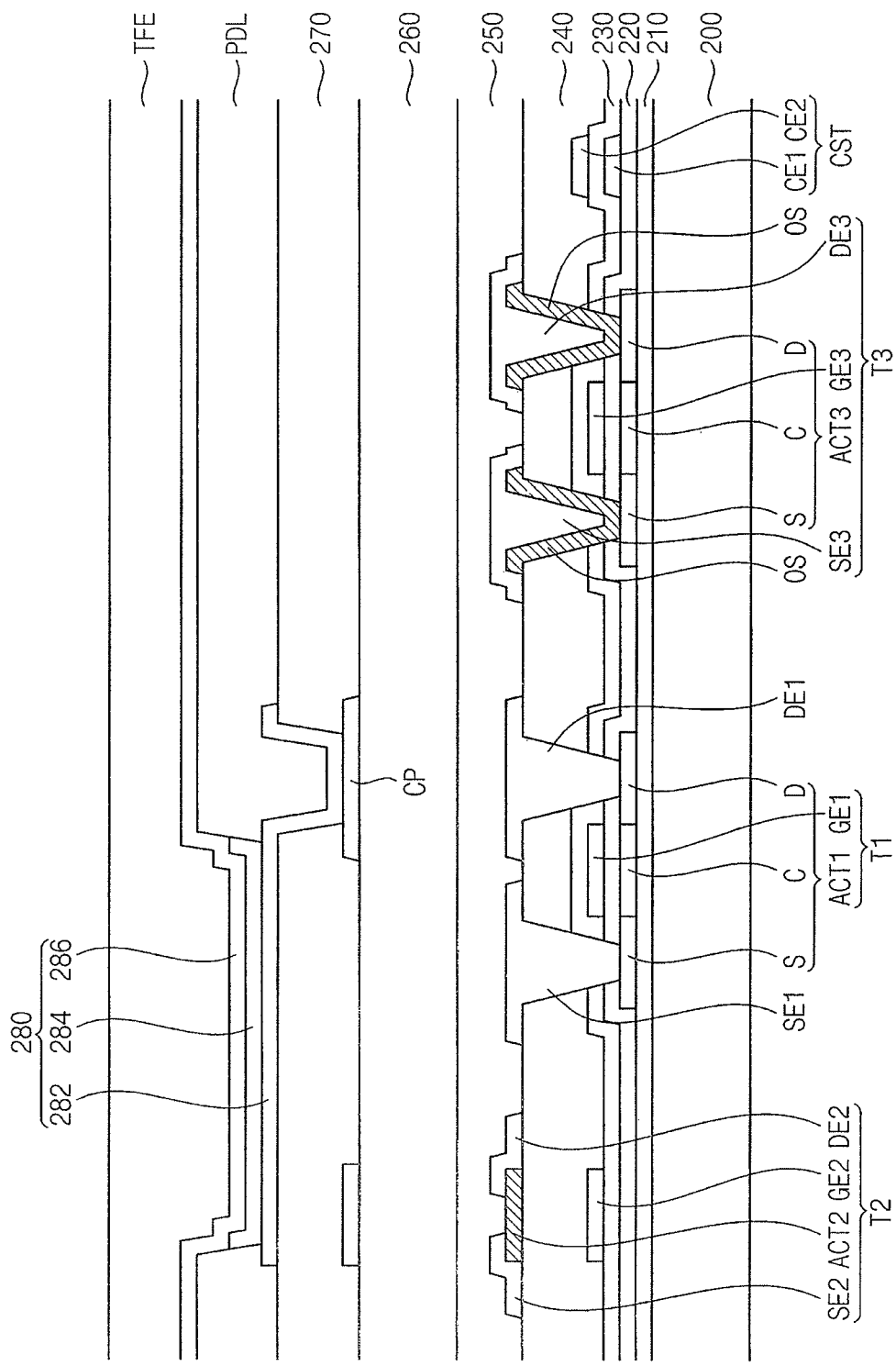
Figure 11A:
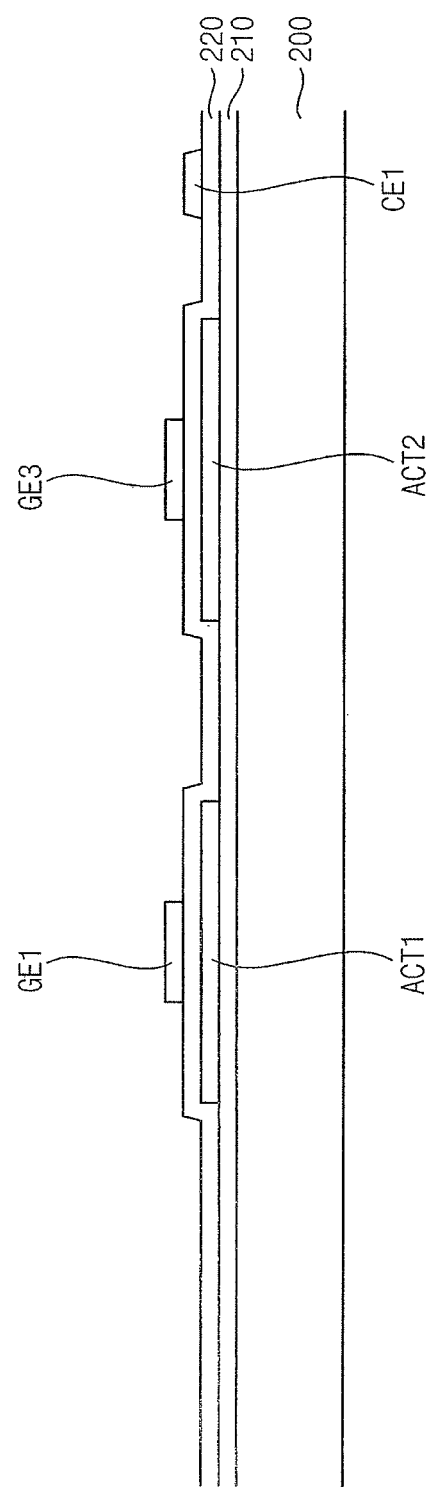
FIGS. 11A to 11E illustrate cross-sectional views of stages in a method of manufacturing the display apparatus of FIG. 6.
Figure 11B:
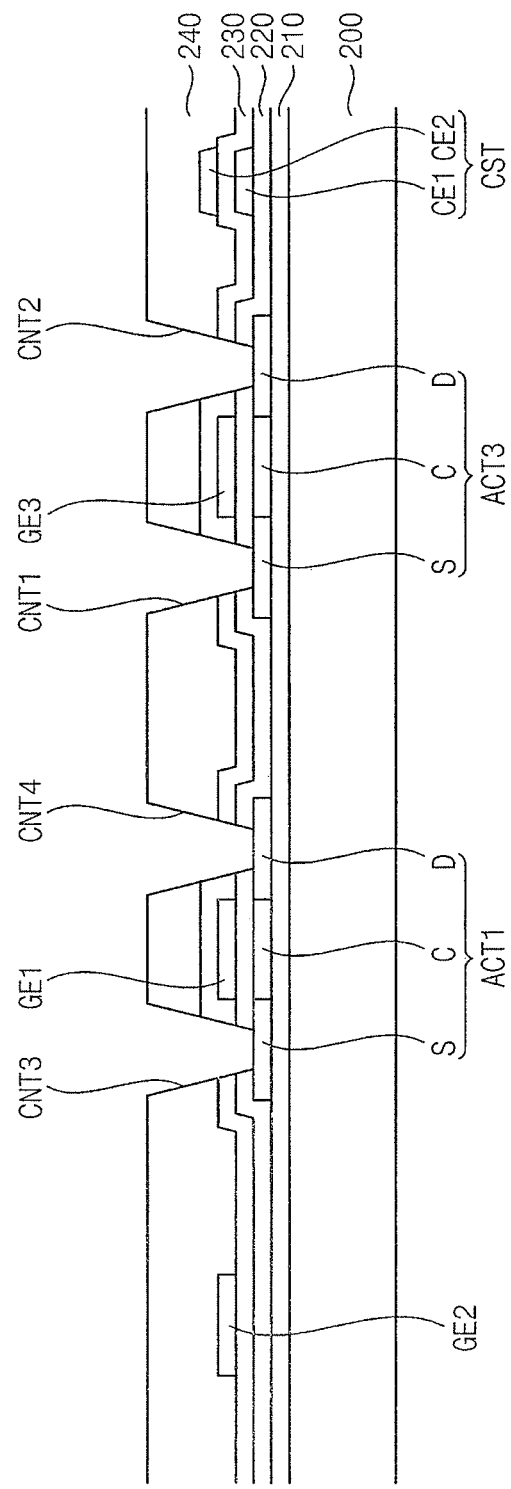
Figure 11C:
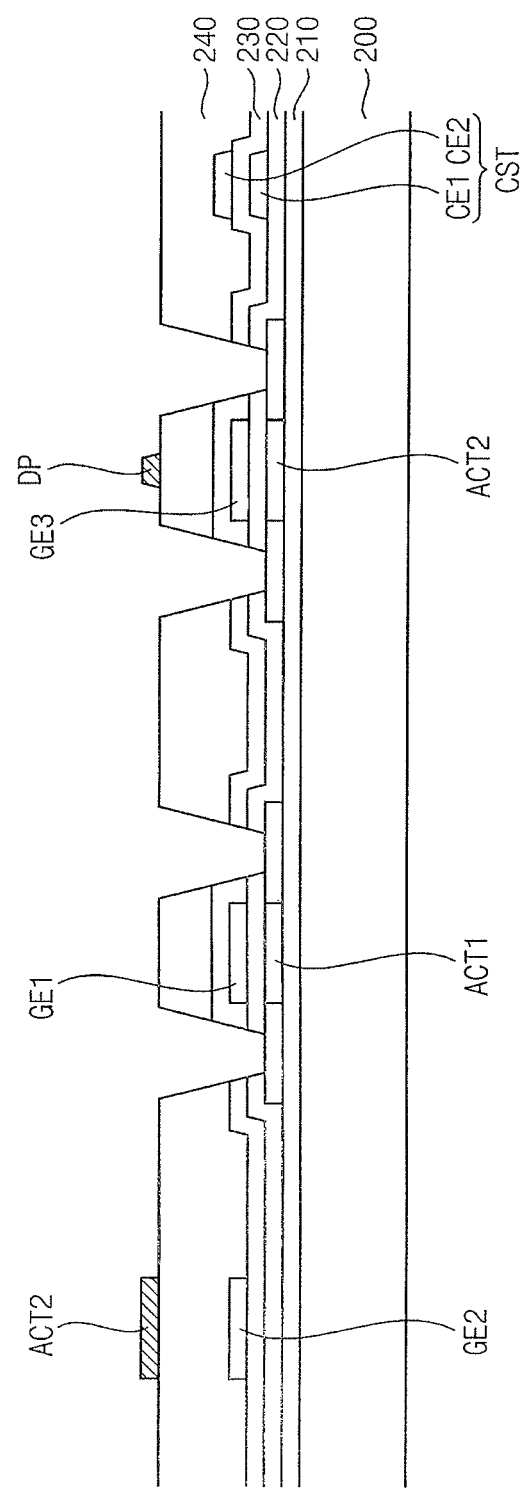
Figure 11D:
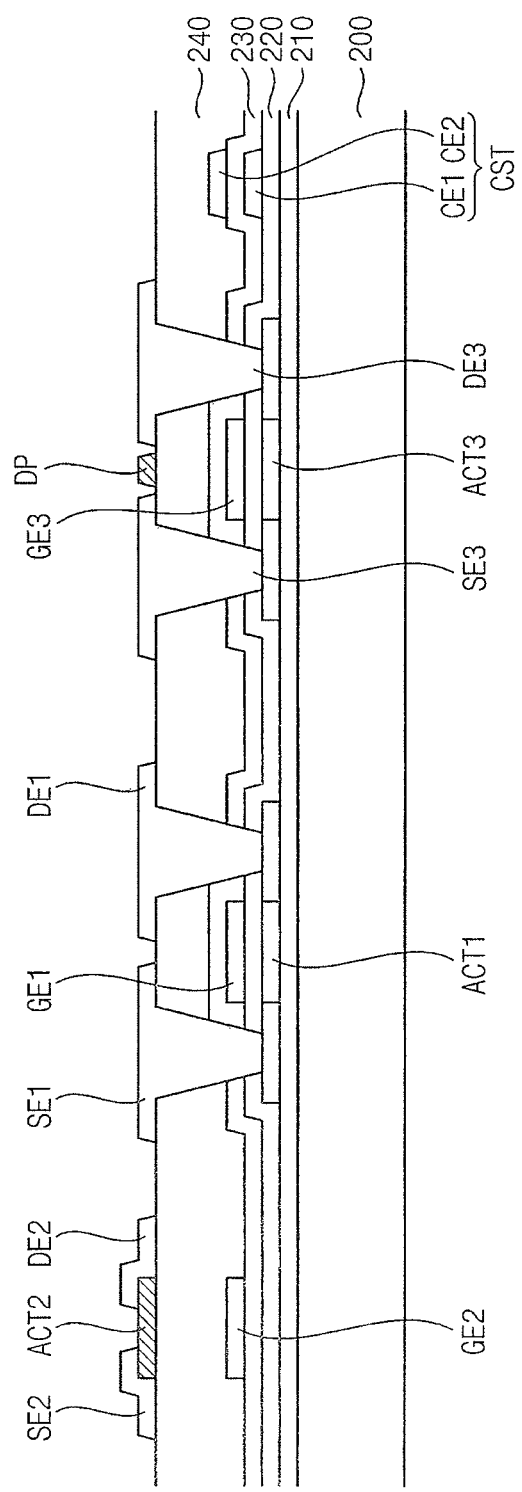
Figure 11E:
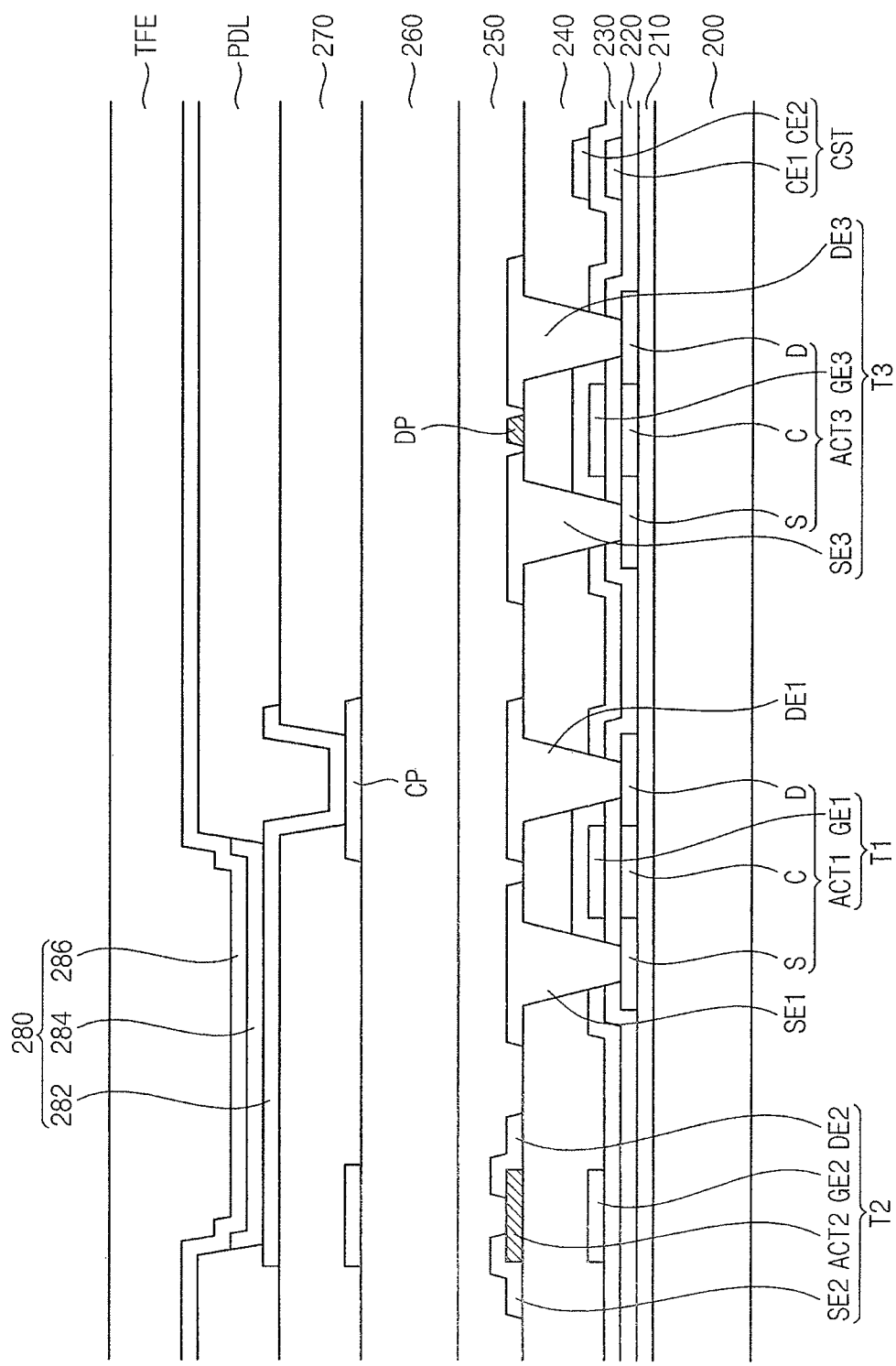

Referring to FIG. 10E, the third insulation layer 250 may be formed on the second_second insulation layer 240 on which the first source/data pattern is formed. Thereafter, the fourth insulation layer 260, a second source/drain pattern including the contact pad CP may be formed, and the fifth insulation layer 270, the first electrode 282, a pixel defining layer PDL, the light emitting layer 284, the second electrode 286, and the thin-film encapsulating layer TFE may be formed to manufacture the display apparatus.

FIGS. 11A to 11E illustrate cross-sectional views of stages in a method of manufacturing the display apparatus of FIG. 6.

Referring to FIGS. 11A to 11E, the method of manufacturing of the display apparatus may be substantially the same as the manufacturing method of FIGS. 10A to 10E except that the oxide semiconductor pattern is the dummy pattern DP. Therefore, some aspects of the description may not be repeated.

An oxide semiconductor layer may be formed on the second_second insulation layer 240 through which first to fourth contact holes CNT1 to CNT4 are formed. The second active pattern ACT2 and the dummy pattern DP may be formed by patterning the oxide semiconductor layer. An annealing process of heating the oxide semiconductor layer or the dummy pattern may be performed. Thereafter, a second source/drain pattern may be formed.

By way of summation and review, in order to improve display quality of a display apparatus, it is desired to improve electrical characteristics of a thin film transistor. In addition, there are cases where it is desirable that characteristics of thin film transistors be different depending on a role of each thin film transistor in a pixel circuit.

As described above, embodiments relate to a display apparatus including a low temperature polysilicon (LTPS) thin film transistor and a method of manufacturing the display apparatus. Embodiments may provide a display apparatus capable of improving display quality by improving electron mobility of a thin film transistor formed through a low temperature polysilicon (LTPS) process.

According to an example embodiment, the polysilicon active pattern of the thin film transistor of the display apparatus may be in direct contact with the oxide semiconductor pattern in the process of forming the oxide semiconductor pattern, so that electron mobility of the polysilicon active pattern may be improved. The oxide semiconductor pattern may affect the polysilicon active pattern in the process of forming the oxide semiconductor pattern, separately from the impurity doping process to the polysilicon active pattern p-Si. Therefore, the electrical characteristics of the thin film transistor may be improved.

In addition, the oxide semiconductor pattern may be a dummy pattern that is not electrically connected to the thin film transistor. A characteristic as conductor may not be significant, and no additional process may be implemented to improve electrical conductivity.

In an example embodiment, a polysilicon transistor having a large DR is used as a driving transistor, an oxide semiconductor transistor having a good switching characteristic is used as a switching transistor, and a polysilicon transistor having improved electric mobility is used as a circuit constituting transistor. Thus, display quality of the display apparatus may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a base substrate;
a polysilicon active pattern disposed on the base substrate, the polysilicon active pattern including polycrystalline silicon and indium, and further including a source region and a drain region each doped with impurities and a channel region between the source region and the drain region;
a first gate electrode overlapping the channel region;
a source electrode electrically connected to the source region and a drain electrode electrically connected to the drain region; and
an oxide semiconductor pattern disposed between the source electrode and the source region and between the drain electrode and the drain region, the oxide semiconductor pattern directly contacting the source region and the drain region.

2. The display apparatus as claimed in claim 1, wherein the oxide semiconductor pattern contacts one or more of source electrode and the drain electrode.

3. The display apparatus as claimed in claim 2, further comprising:
a driving active pattern on the base substrate, the driving active pattern including polycrystalline silicon, the driving active pattern including source and drain regions doped with impurities, and the driving active pattern including a channel region between the source region and the drain region;
a driving gate electrode overlapping the channel region of the driving active pattern; and
driving source and driving drain electrodes electrically connected to the source and drain region of the driving active pattern, respectively, wherein
an amount of indium introduced into the polysilicon active pattern is higher than that of the driving active pattern.

4. The display apparatus as claimed in claim 3, wherein:
the oxide semiconductor pattern does not make contact with a driving thin film transistor that includes the driving active pattern, the driving gate electrode, and the driving source and drain electrodes.

5. The display apparatus as claimed in claim 1, further comprising:
a buffer layer between the polysilicon active pattern and the base substrate;
a first insulation layer between the polysilicon active pattern and the first gate electrode; and
a second insulation layer between the source and drain electrodes and the first gate electrode,
wherein first and second contact holes are formed through the first insulation layer, and the polysilicon active pattern is electrically connected to the source and drain electrodes through the first and second contact holes.

6. The display apparatus as claimed in claim 5, wherein:
the oxide semiconductor pattern is in the first and second contact holes, and
the oxide semiconductor pattern is in contact with the source electrode and the source region, or in contact with the drain electrode and the drain region.

7. The display apparatus as claimed in claim 5, further comprising a second gate electrode, wherein:
the second insulation layer includes a second_first insulation layer and a second_second insulation layer on the second_first insulation layer, and
the second gate electrode is between the second_first insulation layer and the second_second insulation layer.

8. The display apparatus as claimed in claim 5, further comprising:
an oxide gate electrode between the second insulation layer and the first insulation layer;
an oxide semiconductor active pattern overlapping the oxide gate electrode, and on the second insulation layer; and
an oxide source electrode and an oxide drain electrode partially overlapping the oxide active pattern, wherein:
the oxide semiconductor active pattern and the oxide semiconductor pattern are formed from a same layer, and
the oxide source electrode and the oxide drain electrode are formed from the source electrode and the drain electrode.

9. A method of manufacturing a display apparatus, the method comprising:
forming a polysilicon active pattern on a base substrate, the polysilicon active pattern including polycrystalline silicon, and further including a source region and a drain region with a channel region between the source region and the drain region;
forming a first insulation layer;
forming a gate electrode on the first insulation layer;
forming a second insulation layer on the first insulation layer on which the gate electrode is formed;
forming an oxide semiconductor pattern including an oxide semiconductor on the second insulation layer; and
forming a source electrode and a drain electrode on the second insulation layer on which the oxide semiconductor pattern is formed, the oxide semiconductor pattern being disposed between the source electrode and the source region and between the drain electrode and the drain region, the oxide semiconductor pattern directly contacting the source region and the drain region.

10. The method as claimed in claim 9, further comprising forming a contact hole that exposes the polysilicon active pattern through the first and second insulation layers,
wherein in forming the oxide semiconductor pattern, the oxide semiconductor pattern is formed in the contact hole exposing the polysilicon active pattern.

11. The method as claimed in claim 10, further comprising annealing the oxide semiconductor pattern.

12. The method as claimed in claim 11, wherein:
the oxide semiconductor pattern is in the contact hole, and
the oxide semiconductor pattern is in contact with the source electrode or in contact with the drain electrode.

13. The method as claimed in claim 12, further comprising a process of increasing electrical conductivity of the oxide semiconductor pattern.

14. The method as claimed in claim 9, wherein:
in forming the gate electrode, an oxide gate electrode is further formed,
in forming the semiconductor pattern, an oxide semiconductor active pattern overlapping the oxide gate electrode is further formed on the second insulation layer, and
in forming the source and drain electrodes, an oxide source electrode and an oxide drain electrode that partially overlap the oxide semiconductor active pattern are further formed.

15. The method as claimed in claim 14, wherein forming the gate electrode and the oxide semiconductor and forming the second insulation layer includes:
forming a first gate pattern including the gate electrode overlapping the polysilicon active pattern on the first insulation layer;
forming a second_first insulation layer on the first insulation layer on which the first gate pattern is formed;
forming a second gate pattern and the oxide gate electrode; and
forming a second_second insulation layer on the second gate pattern and the oxide gate electrode.

16. The method as claimed in claim 9, wherein:
in forming the polysilicon active pattern, a driving active pattern including the polycrystalline silicon is further formed,
in forming the gate electrode, a driving gate electrode is further formed, and
in forming the oxide semiconductor pattern, the oxide semiconductor pattern does not make contact with a driving thin film transistor that includes the driving active pattern.

17. The method as claimed in claim 9, wherein the second insulation layer includes silicon oxide.

18. A display apparatus, comprising:
a base substrate;
a polysilicon active pattern disposed on the base substrate, the polysilicon active pattern including polycrystalline silicon and indium, the polysilicon active pattern including a source region and a drain region each doped with impurities and a channel region between the source region and the drain region;
a first gate electrode overlapping the channel region;
a source electrode electrically connected to the source region and a drain electrode electrically connected to the drain region; and
an oxide semiconductor pattern disposed on the base substrate, the oxide semiconductor pattern being separate from and adjacent to one or more of the source electrode and the drain electrode such that the oxide semiconductor pattern is not electrically connected to the one or more of the source electrode and the drain electrode.

19. The display apparatus as claimed in claim 18, wherein the oxide semiconductor pattern is between the source electrode and the drain electrode on a second insulation layer.

20. The display apparatus as claimed in claim 19, further comprising:
a driving active pattern on the base substrate, the driving active pattern including polycrystalline silicon, the driving active pattern including source and drain regions doped with impurities, the driving active pattern further including a channel region between the source region and the drain region;
a driving gate electrode overlapping the channel region of the driving active pattern; and
driving source and driving drain electrodes electrically connected to the source and drain region of the driving active pattern, respectively, wherein
an amount of indium introduced into the polysilicon active pattern is higher than that of the driving active pattern, and
the oxide semiconductor pattern does not make contact with a driving thin film transistor that includes the driving active pattern, the driving gate electrode, and the driving source and drain electrodes.

21. A method of manufacturing a display apparatus, the method comprising:

forming a polysilicon active pattern on a base substrate, the polysilicon active pattern including polycrystalline silicon;

forming a first insulation layer on the base substrate;

forming a gate electrode on the first insulation layer;

forming a second insulation layer on the first insulation layer on which the gate electrode is formed;

forming an oxide semiconductor pattern including an oxide semiconductor on the second insulation layer; and forming a source electrode and a drain electrode on the second insulation layer on which the oxide semiconductor pattern is formed, the oxide semiconductor pattern being between the source electrode and the drain electrode on the second insulation layer.

22. The method as claimed in claim 21, wherein:

in forming the polysilicon active pattern, a driving active pattern including the polycrystalline silicon is further formed, in forming the gate electrode, a driving gate electrode is further formed, in forming the oxide semiconductor pattern, the oxide semiconductor pattern does not make contact with a driving thin film transistor that includes the driving active pattern.

* * * * *